United States Patent
Kang et al.

(10) Patent No.: US 7,290,202 B2
(45) Date of Patent: Oct. 30, 2007

(54) MB810 ENCODER/DECODER, DUAL MODE ENCODER/DECODER, AND MB810 CODE GENERATING METHOD

(75) Inventors: Sungsoo Kang, Daejeon (KR); Tae Whan Yoo, Daejeon (KR); Hyeong Ho Lee, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 530 days.

(21) Appl. No.: 10/848,944

(22) Filed: May 19, 2004

(65) Prior Publication Data

US 2005/0012646 A1    Jan. 20, 2005

(30) Foreign Application Priority Data

Jul. 15, 2003   (KR) .................... 10-2003-0048426

(51) Int. Cl.
*H03M 13/00* (2006.01)
*G06F 11/00* (2006.01)
*G08C 25/00* (2006.01)
*H04L 1/00* (2006.01)

(52) U.S. Cl. .................. 714/799; 714/759; 341/58; 341/59; 341/67; 341/102

(58) Field of Classification Search .............. 714/799, 714/759; 341/58–59, 67, 102
See application file for complete search history.

(56) References Cited

U.S. PATENT DOCUMENTS

| | | |
|---|---|---|
| 4,486,739 A | 12/1984 | Franaszek et al. |
| 5,663,724 A | 9/1997 | Westby |
| 6,362,757 B1 | 3/2002 | Lee et al. |
| 6,425,107 B1 | 7/2002 | Caldara et al. |
| 6,441,756 B1 | 8/2002 | Shim |
| 6,501,396 B1 | 12/2002 | Kryzak et al. |

FOREIGN PATENT DOCUMENTS

KR    1020030020519 A    3/2003

OTHER PUBLICATIONS

MB810 Implementation for HARI, IEEE P802.3 Plenary Meeting,Mar. 6-10, 2000, 18 pages.
MB810 Implementation for HARI, IEEE P802.3ae Plenary Meeting, Mar. 6-10, 2000, 15 pages.

*Primary Examiner*—Guy J. Lamarre
(74) *Attorney, Agent, or Firm*—Blakely, Sokoloff, Taylor & Zafman

(57) ABSTRACT

An MB810 encoder and/or decoder, dual mode encoder and/or decoder, and a method for generating MB810 codes are provided. Twelve state points in the form of a 4×3 matrix on a state transition map are formed with binary unit digital sum variation & alternate sum variation (BUDA). A 10-bit code from 8-bit data is generated outputting a 10-bit code from a predetermined state point to form the matrix. Codes forming a complementary pair from a set of codes capable of arriving at state points forming the matrix are selected. Codes forming the 12 state points by supplementing state points lacked in the codes forming a complementary pair are selected. Control codes including IDLE code from the codes forming the 12 state points are selected. Codes generating the IDLE code by a bit string between neighboring codes among the codes forming the 12 state points are removed.

33 Claims, 22 Drawing Sheets

FIG. 2A

| Decimal number | Octet_bit states | Group A_L s3,4,5,9,10,11 | Group A_R s0,1,2,6,7,8 |
|---|---|---|---|
| 0 | 00000000 | 0010110011 | 1101001100 |
| 1 | 00000001 | 1101001010 | 0010110101 |
| 2 | 00000010 | 0010110110 | 1101001001 |
| 3 | 00000011 | 0011001011 | 1100110100 |
| 4 | 00000100 | 1100110010 | 0011001101 |
| 5 | 00000101 | 1100101100 | 0011010011 |
| 6 | 00000110 | 1100101001 | 0011010110 |
| 7 | 00000111 | 1100100110 | 0011011001 |
| 8 | 00001000 | 0011011010 | 1100100101 |
| 9 | 00001001 | 0100101011 | 1011010100 |
| 10 | 00001010 | 1011010010 | 0100101101 |
| 11 | 00001011 | 1011001100 | 0100110011 |
| 12 | 00001100 | 1011001001 | 0100110110 |
| 13 | 00001101 | 1010110100 | 0101001011 |
| 14 | 00001110 | 1010100101 | 0101011010 |
| 15 | 00001111 | 1010011001 | 0101100110 |
| 16 | 00010000 | 1010010110 | 0101101001 |
| 17 | 00010001 | 0101101010 | 1010010101 |
| 18 | 00010010 | 1010010011 | 0101101100 |
| 19 | 00010011 | 1001101100 | 0110010011 |
| 20 | 00010100 | 1001101001 | 0110010110 |
| 21 | 00010101 | 1001100110 | 0110011001 |
| 22 | 00010110 | 0110011010 | 1001100101 |
| 23 | 00010111 | 1001011010 | 0110100101 |
| 24 | 00011000 | 0110100110 | 1001011001 |
| 25 | 00011001 | 0110101001 | 1001010110 |
| 26 | 00011010 | 0110101100 | 1001010011 |
| 27 | 00011011 | 0110110010 | 1001001101 |
| 28 | 00011100 | 1001001011 | 0110110100 |
| 29 | 00011101 | 1110010010 | 0001101101 |
| 30 | 00011110 | 0100101110 | 1011010001 |
| 31 | 00011111 | 0001101110 | 1110010001 |
| 32 | 00100000 | 0010111001 | 1101000110 |
| 33 | 00100001 | 1011000110 | 0100111001 |
| 34 | 00100010 | 0100111010 | 1011000101 |
| 35 | 00100011 | 1010110001 | 0101001110 |
| 36 | 00100100 | 1110001001 | 0001110110 |
| 37 | 00100101 | 1010011100 | 0101100011 |
| 38 | 00100110 | 0011001110 | 1100110001 |
| 39 | 00100111 | 1110100100 | 0001011011 |
| 40 | 00101000 | 1101100010 | 0010011101 |
| 41 | 00101001 | 0010100111 | 1101011000 |
| 42 | 00101010 | 1010001101 | 0101110010 |
| 43 | 00101011 | 0110001011 | 1001110100 |
| 44 | 00101100 | 1001110010 | 0110001101 |
| 45 | 00101101 | 0110001110 | 1001110001 |
| 46 | 00101110 | 1110011000 | 0001100111 |
| 47 | 00101111 | 1100100011 | 0011011100 |
| 48 | 00110000 | 0011100011 | 1100011100 |
| 49 | 00110001 | 1100011010 | 0011100101 |

FIG. 2B

| Decimal number | Octet_bit states | Group A_L s0,1,3,4,6,9 | Group A_R s2,5,7,8,10,11 |
|---|---|---|---|
| 50 | 00110010 | 1001100011 | 0110011100 |
| 51 | 00110011 | 0110100011 | 1001011100 |
| 52 | 00110100 | 0011100110 | 1100011001 |
| 53 | 00110101 | 0011101001 | 1100010110 |
| 54 | 00110110 | 0011101100 | 1100010011 |
| 55 | 00110111 | 1011100100 | 0100011011 |
| 56 | 00111000 | 1001001110 | 0110110001 |
| 57 | 00111001 | 1011011000 | 0100100111 |
| 59 | 00111011 | 1101100110 | 0010011001 |
| 60 | 00111100 | 1101011010 | 0010100101 |
| 61 | 00111101 | 1101001011 | 0010110100 |
| 62 | 00111110 | 1100110110 | 0011001001 |
| 63 | 00111111 | 1100110011 | 0011001100 |
| 64 | 01000000 | 1100101101 | 0011010010 |
| 65 | 01000001 | 0011011011 | 1100100100 |
| 66 | 01000010 | 1011011001 | 0100100110 |
| 67 | 01000011 | 1011010110 | 0100101001 |
| 68 | 01000100 | 1011010011 | 0100101100 |
| 69 | 01000101 | 1011001101 | 0100110010 |
| 70 | 01000110 | 1010110101 | 0101001010 |
| 71 | 01000111 | 0101101011 | 1010010100 |
| 72 | 01001000 | 1001101101 | 0110010010 |
| 73 | 01001001 | 0110011011 | 1001100100 |
| 74 | 01001010 | 1001011011 | 0110100100 |
| 75 | 01001011 | 0110101101 | 1001010010 |
| 76 | 01001100 | 0110110011 | 1001001100 |
| 77 | 01001101 | 0110110110 | 1001001001 |
| 78 | 01001110 | 1100100111 | 0011011000 |
| 79 | 01001111 | 1101110010 | 0010001101 |
| 80 | 01010000 | 1100011011 | 0011100100 |
| 81 | 01010001 | 0011101101 | 1100010010 |
| 82 | 01010010 | 1011100101 | 0100011010 |
| 83 | 01010011 | 1011011100 | 0100100011 |
| 84 | 01010100 | 1110110100 | 0001001011 |
| 85 | 01010101 | 1110110001 | 0001001110 |
| 86 | 01010110 | 1110100101 | 0001011010 |
| 87 | 01010111 | 1101100011 | 0010011100 |
| 88 | 01011000 | 1011000111 | 0100111000 |
| 89 | 01011001 | 0100111011 | 1011000100 |
| 90 | 01011010 | 1110011100 | 0001100011 |
| 91 | 01011011 | 1010011101 | 0101100010 |
| 92 | 01011100 | 1010010111 | 0101101000 |
| 93 | 01011101 | 1101001110 | 0010110001 |
| 94 | 01011110 | 0101101110 | 1010010001 |
| 95 | 01011111 | 1001110110 | 0110001001 |
| 96 | 01100000 | 1001110011 | 0110001100 |
| 97 | 01100001 | 1110011001 | 0001100110 |
| 98 | 01100010 | 1001100111 | 0110011000 |
| 99 | 01100011 | 0010110111 | 1101001000 |
| 100 | 01100100 | 1100111001 | 0011000110 |
| 101 | 01100101 | 0110100111 | 1001011000 |

FIG. 2C

| Decimal number | Octet_bit states | Group A_L s3,4,5,6,7,8,9,10,11 | Group A_R s0,1,2 |
|---|---|---|---|
| 102 | 01100110 | 1110010110 | 0001101001 |
| 103 | 01100111 | 1110010011 | 0001101100 |
| 104 | 01101000 | 1110001101 | 0001110010 |
| 105 | 01101001 | 0110111001 | 1001000110 |
| 106 | 01101010 | 1000110111 | 0111001000 |
| 107 | 01101011 | 0111001011 | 1000110100 |
| 108 | 01101100 | 0111001110 | 1000110001 |
| 109 | 01101101 | 0111011010 | 1000100101 |
| 110 | 01101110 | 0111110010 | 1000001101 |
| 111 | 01101111 | 0100111110 | 1011000001 |
| 112 | 01110000 | 0011011110 | 1100100001 |
| 113 | 01110001 | 1100011110 | 0011100001 |
| 114 | 01110010 | 1101101100 | 0010010011 |
| 115 | 01110011 | 0101111010 | 1010000101 |
| 116 | 01110100 | 1001111001 | 0110000110 |
| 117 | 01110101 | 0011111001 | 1100000110 |
| 118 | 01110110 | 1110000111 | 0001111000 |
| 119 | 01110111 | 0111101100 | 1000010011 |
| 120 | 01111000 | 0111101001 | 1000010110 |
| 121 | 01111001 | 0011110110 | 1100001001 |
| 122 | 01111010 | 1011110100 | 0100001011 |
| 123 | 01111011 | 0110011110 | 1001100001 |
| 124 | 01111100 | 1001011110 | 0110100001 |
| 125 | 01111101 | 1011110001 | 0100001110 |
| 126 | 01111110 | 0001111011 | 1110000100 |
| 127 | 01111111 | 0010111101 | 1101000010 |
| 128 | 10000000 | 0111100110 | 1000011001 |
| 129 | 10000001 | 1100111100 | 0011000011 |
| 130 | 10000010 | 1101111000 | 0010000111 |
| 131 | 10000011 | 0111100011 | 1000011100 |
| 132 | 10000100 | 0110111100 | 1001000011 |
| 133 | 10000101 | 1000111101 | 0111000010 |
| 134 | 10000110 | 0001111110 | 1110000001 |
| 135 | 10000111 | 0011111100 | 1100000011 |
| 136 | 10001000 | 0111111000 | 1000000111 |
| 137 | 10001001 | 0001101011 | 1101010001 |
| 138 | 10001010 | 0110111000 | 1101000101 |
| 139 | 10001011 | 1000111001 | 1101010100 |
| 140 | 10001100 | 1000110110 | 0001110101 |
| 141 | 10001101 | 0111001010 | 0101110100 |
| 142 | 10001110 | 1000110011 | 0101011100 |
| 143 | 10001111 | 1000101101 | 0100010111 |
| 144 | 10010000 | 1000100111 | 0101000111 |
| 145 | 10010001 | 1000011110 | 0101100101 |
| 146 | 10010010 | 0001111010 | 0110010101 |
| 147 | 10010011 | 1100001110 | 0111010001 |
| 148 | 10010100 | 0111100010 | 0101010011 |
| 149 | 10010101 | 0010111100 | 0101010110 |
| 150 | 10010110 | 1011100001 | 0111010100 |
| 151 | 10010111 | 0010011110 | 0101110001 |
| 152 | 10011000 | 1011000011 | 0100011101 |

FIG. 2D

| Decimal number | Octet_bit states | Group A_L s0,1,2,3,4,5,6,7,8 | Group A_R s9,10,11 |
|---|---|---|---|
| 153 | 10011001 | 1000011011 | 0011010101 |
| 154 | 10011010 | 1010000111 | 1100010101 |
| 155 | 10011011 | 1001111000 | 0001010111 |
| 156 | 10011100 | 1000111100 | 1001010101 |
| 157 | 10011101 | 1110000011 | 0100110101 |
| 158 | 10011110 | 1110100001 | 0101001101 |
| 159 | 10011111 | 1110000110 | 0111000101 |
| 160 | 10100000 | 0010011011 | 0101011001 |

| Decimal number | Octet_bit states | Group A_L s0,1,2,3,4,5,6,7,8 | Group A_R s9,10,11 |
|---|---|---|---|
| 161 | 10100001 | 0010101110 | 1110010100 |
| 162 | 10100010 | 0010111010 | 1001000111 |
| 163 | 10100011 | 0010101011 | 0111000110 |
| 164 | 10100100 | 1110001010 | 0111001001 |
| 165 | 10100101 | 1010001011 | 1000110101 |
| 166 | 10100110 | 1010100011 | 0111001100 |
| 167 | 10100111 | 1011101000 | 0111010010 |
| 168 | 10101000 | 1010111000 | 0111011000 |
| 169 | 10101001 | 1010011010 | 0111100001 |
| 170 | 10101010 | 1001101010 | 1110000101 |
| 171 | 10101011 | 1000101110 | 0011110001 |
| 172 | 10101100 | 1010101100 | 1000011101 |
| 173 | 10101101 | 1010101001 | 1101000011 |
| 174 | 10101110 | 1000101011 | 0100011110 |
| 175 | 10101111 | 1010001110 | 1101100001 |
| 176 | 10110000 | 1011100010 | 0100111100 |
| 177 | 10110001 | 1100101010 | 0111100100 |
| 178 | 10110010 | 0011101010 | 0101111000 |
| 179 | 10110011 | 1110101000 | 0110000111 |
| 180 | 10110100 | 0110101010 | 0111000011 |
| 181 | 10110101 | 1011001010 | 0001111100 |
| 182 | 10110110 | 1010110010 | 0001011110 |
| 183 | 10110111 | 1000111010 | 0001111001 |
| 184 | 10111000 | 1010100110 | 1101100100 |

| Decimal number | Octet_bit states | Group A_L s7,9,10 | Group A_R s1,2,4 | Group B_L* s0,3,6 | Group_B_R* s5,8,11 |
|---|---|---|---|---|---|
| 185 | 10111001 | 1101101010 | 0010010101 | 1101101101 | 0010010010 |
| 186 | 10111010 | 1100101011 | 0011010100 | 1101011011 | 0010100100 |
| 187 | 10111011 | 1011011010 | 0100100101 | 1110010111 | 0001101000 |
| 188 | 10111100 | 1011001011 | 0100110100 | 0111100111 | 1000011000 |
| 189 | 10111101 | 1010110110 | 0101001001 | 1101110011 | 0010001100 |
| 190 | 10111110 | 1010110011 | 0101001100 | 1110110101 | 0001001010 |
| 191 | 10111111 | 1010101101 | 0101010010 | 1101100111 | 0010011000 |
| 192 | 11000000 | 1010011011 | 0101100100 | 1110011101 | 0001100010 |
| 193 | 11000001 | 1001101011 | 0110010100 | 1100110111 | 0011001000 |
| 194 | 11000010 | 0110101011 | 1001010100 | 1011011101 | 0100100010 |
| 195 | 11000011 | 0010111011 | 1101000100 | 1011010111 | 0100101000 |
| 196 | 11000100 | 1100111010 | 0011000101 | 1001110111 | 0110001000 |
| 197 | 11000101 | 1100101110 | 0011010001 | 1011110101 | 0100001010 |
| 198 | 11000110 | 1110110010 | 0001001101 | 0111011011 | 1000100100 |
| 199 | 11000111 | 0011101011 | 1100010100 | 1101011110 | 0010100001 |

FIG. 2E

| Decimal number | Octet_bit states | Group A_L s0,1,4 | Group A_R s7,10,11 | Group B_L* s3,6,9 | Group_B_R* s2,5,8 |
|---|---|---|---|---|---|
| 200 | 11001000 | 0011101110 | 1100010001 | 1001111101 | 0110000010 |
| 201 | 11001001 | 1011101100 | 0100010011 | 1101110110 | 0010001001 |
| 202 | 11001010 | 1011101001 | 0100010110 | 1100111101 | 0011000010 |
| 203 | 11001011 | 1011100110 | 0100011001 | 1101111100 | 0010000011 |
| 204 | 11001100 | 1010011110 | 0101100001 | 0111111001 | 1000000110 |
| 205 | 11001101 | 1011100011 | 0100011100 | 1101111001 | 0010000110 |
| 206 | 11001110 | 1110101100 | 0001010011 | 0101111011 | 1010000100 |
| 207 | 11001111 | 1011001110 | 0100110001 | 0011110111 | 1100001000 |
| 208 | 11010000 | 1110101001 | 0001010110 | 0111011110 | 1000100001 |
| 209 | 11010001 | 1010111001 | 0101000110 | 0011111101 | 1100000010 |
| 210 | 11010010 | 1110100110 | 0001011001 | 0101111110 | 1010000001 |
| 211 | 11010011 | 1110100011 | 0001011100 | 0110110111 | 1001001000 |
| 212 | 11010100 | 1110011010 | 0001100101 | 0111101101 | 1000010010 |
| 213 | 11010101 | 1010100111 | 0101011000 | 0110111101 | 1001000010 |
| 214 | 11010110 | 1110001110 | 0001110001 | 0111110110 | 1000001001 |
| 215 | 11010111 | 1001101110 | 0110010001 | 0111110011 | 1000001100 |

| Decimal number | Octet_bit states | Group A_L s0,1,4 | Group A_R s7,10,11 | Group B_L* s3,6,9 | Group_B_R* s2,5,8 |
|---|---|---|---|---|---|
| 216 | 11011000 | 1101100101 | 0010011010 | 1101101011 | 0010010100 |
| 217 | 11011001 | 1101011001 | 0010100110 | 1011011011 | 0100100100 |
| 218 | 11011010 | 1101010110 | 0010101001 | 1110110011 | 0001001100 |
| 219 | 11011011 | 1101010011 | 0010101100 | 1110101101 | 0001010010 |
| 220 | 11011100 | 1101001101 | 0010110010 | 1110100111 | 0001011000 |
| 221 | 11011101 | 1100110101 | 0011001010 | 1110011011 | 0001100100 |
| 222 | 11011110 | 1011010101 | 0100101010 | 1101101110 | 0010010001 |
| 223 | 11011111 | 0101011011 | 1010100100 | 1110111001 | 0001000110 |
| 224 | 11100000 | 0101101101 | 1010010010 | 1100111011 | 0011000100 |
| 225 | 11100001 | 0110110101 | 1001001010 | 1011101101 | 0100010010 |
| 226 | 11100010 | 1101000111 | 0010111000 | 1011100111 | 0100011000 |
| 227 | 11100011 | 1101011100 | 0010100011 | 1110110110 | 0001001001 |
| 228 | 11100100 | 0011010111 | 1100101000 | 1010110111 | 0101001000 |
| 229 | 11100101 | 0011011101 | 1100100010 | 1010111101 | 0101000010 |
| 230 | 11100110 | 1100011101 | 0011100010 | 1110111100 | 0001000011 |
| 231 | 11100111 | 1100010111 | 0011101000 | 1110011110 | 0001100001 |
| 232 | 11101000 | 0001110111 | 1110001000 | 1101111010 | 0010000101 |
| 233 | 11101001 | 0100110111 | 1011001000 | 1001111110 | 0110000001 |
| 234 | 11101010 | 1101110100 | 0010001011 | 1011110110 | 0100001001 |
| 235 | 11101011 | 1101110001 | 0010001110 | 1011111001 | 0100000110 |
| 236 | 11101100 | 0101110011 | 1010001100 | 1011011110 | 0100100001 |
| 237 | 11101101 | 0101110110 | 1010001001 | 0111101011 | 1000010100 |
| 238 | 11101110 | 1001110101 | 0110001010 | 0111101110 | 1000010001 |
| 239 | 11101111 | 0110010111 | 1001101000 | 0110111011 | 1001000100 |
| 240 | 11110000 | 0110011101 | 1001100010 | 0110111110 | 1001000001 |
| 241 | 11110001 | 1001011101 | 0110100010 | 1001111011 | 0110000100 |
| 242 | 11110010 | 1001010111 | 0110101000 | 1011111100 | 0100000011 |
| 243 | 11110011 | 1110010101 | 0001101010 | 1011110011 | 0100001100 |
| 244 | 11110100 | 0111000111 | 1000111000 | 0011111011 | 1100000100 |

| Decimal number | Octet_bit states | Group A_L s6,7,9,10 | Group A_R s1,2,4,5 | Group B_L* s0,3 | Group_B_R* s8,11 |
|---|---|---|---|---|---|
| 245 | 11110101 | 1110001011 | 0001110100 | 0111001101 | 1000110010 |
| 246 | 11110110 | 1110111000 | 0001000111 | 0111010011 | 1000101100 |

FIG. 2F

| | | | | | |
|---|---|---|---|---|---|
| 247 | 11110111 | 0110101110 | 1001010001 | 0111010110 | 1000101001 |
| 248 | 11111000 | 0110111010 | 1001000101 | 0111011001 | 1000100110 |
| 249 | 11111001 | 1000111011 | 0111000100 | 0111011100 | 1000100011 |
| 250 | 11111010 | 1001111010 | 0110000101 | 0001111101 | 1110000010 |
| 251 | 11111011 | 1000111110 | 0111000001 | 0111110100 | 1000001011 |
| 252 | 11111100 | 1010111100 | 0101000011 | 0100111101 | 1011000010 |
| 253 | 11111101 | 1011111000 | 0100000111 | 0101111001 | 1010000110 |
| 254 | 11111110 | 1011110010 | 0100001101 | 0101111100 | 1010000011 |
| 255 | 11111111 | 0111101010 | 1000010101 | 0111100101 | 1000011010 |

FIG. 3

| Decimal number | Octet_bit states | Group A_L s6,7,9,10 | Group A_R s1,2,4,5 | Group B_L* s0,3 | Group_B_R* s8,11 |
|---|---|---|---|---|---|
| 256 | MB_a | 0010111110 | 1101000001 | 0011110101 | 1100001010 |
| 257 | MB_b | 0011111010 | 1100000101 | 0101011110 | 1010100001 |

| Decimal number | Octet_bit states | Group A_L s3,4,5,9,10,11 | Group A_R s0,1,2,6,7,8 | Group B_L* s3,4,5,9,10,11 | Group_B_R* s0,1,2,6,7,8 |
|---|---|---|---|---|---|
| 258 | MB_c | 1111001000 | 0000110111 | 0000111011 | 1111000100 |
| 259 | MB_d | 1111000010 | 0000111101 | 0000111110 | 1111000001 |

FIG. 4A

| Decimal number | Octet_bit | Group A_L | Group A_R | Group B_L | Group B_R |
|---|---|---|---|---|---|
| 0 | 00000000 | 0010110011 | 1101001100 | | |
| 1 | 00000001 | 1101001010 | 0010110101 | | |
| 2 | 00000010 | 0010110110 | 1101001001 | | |
| 3 | 00000011 | 0011001011 | 1100110100 | | |
| 4 | 00000100 | 1100110010 | 0011001101 | | |
| 5 | 00000101 | 1100101100 | 0011010011 | | |
| 6 | 00000110 | 1100101001 | 0011010110 | | |
| 7 | 00000111 | 1100100110 | 0011011001 | | |
| 8 | 00001000 | 0011011010 | 1100100101 | | |
| 9 | 00001001 | 0100101011 | 1011010100 | | |
| 10 | 00001010 | 1011010010 | 0100101101 | | |
| 11 | 00001011 | 1011001100 | 0100110011 | | |
| 12 | 00001100 | 1011001001 | 0100110110 | | |
| 13 | 00001101 | 1010110100 | 0101001011 | | |
| 14 | 00001110 | 1010100101 | 0101011010 | | |
| 15 | 00001111 | 1010011001 | 0101100110 | | |
| 16 | 00010000 | 1010010110 | 0101101001 | | |
| 17 | 00010001 | 0101101010 | 1010010101 | | |
| 18 | 00010010 | 1010010011 | 0101101100 | | |
| 19 | 00010011 | 1001101100 | 0110010011 | | |
| 20 | 00010100 | 1001101001 | 0110010110 | | |
| 21 | 00010101 | 1001100110 | 0110011001 | | |
| 22 | 00010110 | 0110011010 | 1001100101 | | |
| 23 | 00010111 | 1001011010 | 0110100101 | | |
| 24 | 00011000 | 0110100110 | 1001011001 | | |
| 25 | 00011001 | 0110101001 | 1001010110 | | |
| 26 | 00011010 | 0110101100 | 1001010011 | | |
| 27 | 00011011 | 0110110010 | 1001001101 | | |
| 28 | 00011100 | 1001001011 | 0110110100 | | |
| 29 | 00011101 | 1110010010 | 0001101101 | | |
| 30 | 00011110 | 0100101110 | 1011010001 | | |
| 31 | 00011111 | 0001101110 | 1110010001 | | |
| 32 | 00100000 | 0010111001 | 1101000110 | | |
| 33 | 00100001 | 1011000110 | 0100111001 | | |
| 34 | 00100010 | 0100111010 | 1011000101 | | |
| 35 | 00100011 | 1010110001 | 0101001110 | | |
| 36 | 00100100 | 1110001001 | 0001110110 | | |
| 37 | 00100101 | 1010011100 | 0101100011 | | |
| 38 | 00100110 | 0011001110 | 1100110001 | | |
| 39 | 00100111 | 1110100100 | 0001011011 | | |
| 40 | 00101000 | 1101100010 | 0010011101 | | |
| 41 | 00101001 | 0010100111 | 1101011000 | | |
| 42 | 00101010 | 1010001101 | 0101110010 | | |
| 43 | 00101011 | 0110001011 | 1001110100 | | |
| 44 | 00101100 | 1001110010 | 0110001101 | | |
| 45 | 00101101 | 0110001110 | 1001110001 | | |
| 46 | 00101110 | 1110011000 | 0001100111 | | |
| 47 | 00101111 | 1100100011 | 0011011100 | | |
| 48 | 00110000 | 0011100011 | 1100011100 | | |

FIG. 4B

| | | | |
|---|---|---|---|
| 49 | 00110001 | 1100011010 | 0011100101 |
| 50 | 00110010 | 1001100011 | 0110011100 |
| 51 | 00110011 | 0110100011 | 1001011100 |
| 52 | 00110100 | 0011100110 | 1100011001 |
| 53 | 00110101 | 0011101001 | 1100010110 |
| 54 | 00110110 | 0011101100 | 1100010011 |
| 55 | 00110111 | 1011100100 | 0100011011 |
| 56 | 00111000 | 1001001110 | 0110110001 |
| 57 | 00111001 | 1011011000 | 0100100111 |
| 59 | 00111011 | 1101100110 | 0010011001 |
| 60 | 00111100 | 1101011010 | 0010100101 |
| 61 | 00111101 | 1101001011 | 0010110100 |
| 62 | 00111110 | 1100110110 | 0011001001 |
| 63 | 00111111 | 1100110011 | 0011001100 |
| 64 | 01000000 | 1100101101 | 0011010010 |
| 65 | 01000001 | 0011011011 | 1100100100 |
| 66 | 01000010 | 1011011001 | 0100100110 |
| 67 | 01000011 | 1011010110 | 0100101001 |
| 68 | 01000100 | 1011010011 | 0100101100 |
| 69 | 01000101 | 1011001101 | 0100110010 |
| 70 | 01000110 | 1010110101 | 0101001010 |
| 71 | 01000111 | 0101101011 | 1010010100 |
| 72 | 01001000 | 1001101101 | 0110010010 |
| 73 | 01001001 | 0110011011 | 1001100100 |
| 74 | 01001010 | 1001011011 | 0110100100 |
| 75 | 01001011 | 0110101101 | 1001010010 |
| 76 | 01001100 | 0110110011 | 1001001100 |
| 77 | 01001101 | 0110110110 | 1001001001 |
| 78 | 01001110 | 1100100111 | 0011011000 |
| 79 | 01001111 | 1101110010 | 0010001101 |
| 80 | 01010000 | 1100011011 | 0011100100 |
| 81 | 01010001 | 0011101101 | 1100010010 |
| 82 | 01010010 | 1011100101 | 0100011010 |
| 83 | 01010011 | 1011011100 | 0100100011 |
| 84 | 01010100 | 1110110100 | 0001001011 |
| 85 | 01010101 | 1110110001 | 0001001110 |
| 86 | 01010110 | 1110100101 | 0001011010 |
| 87 | 01010111 | 1101100011 | 0010011100 |
| 88 | 01011000 | 1011000111 | 0100111000 |
| 89 | 01011001 | 0100111011 | 1011000100 |
| 90 | 01011010 | 1110011100 | 0001100011 |
| 91 | 01011011 | 1010011101 | 0101100010 |
| 92 | 01011100 | 1010010111 | 0101101000 |
| 93 | 01011101 | 1101001110 | 0010110001 |
| 94 | 01011110 | 0101101110 | 1010010001 |
| 95 | 01011111 | 1001110110 | 0110001001 |
| 96 | 01100000 | 1001110011 | 0110001100 |
| 97 | 01100001 | 1110011001 | 0001100110 |
| 98 | 01100010 | 1001100111 | 0110011000 |
| 99 | 01100011 | 0010110111 | 1101001000 |
| 100 | 01100100 | 1100111001 | 0011000110 |
| 101 | 01100101 | 0110100111 | 1001011000 |
| 102 | 01100110 | 1110010110 | 0001101001 |
| 103 | 01100111 | 1110010011 | 0001101100 |
| 104 | 01101000 | 1110001101 | 0001110010 |

FIG. 4C

| | | | |
|---|---|---|---|
| 105 | 01101001 | 0110111001 | 1001000110 |
| 106 | 01101010 | 1000110111 | 0111001000 |
| 107 | 01101011 | 0111001011 | 1000110100 |
| 108 | 01101100 | 0111001110 | 1000110001 |
| 109 | 01101101 | 0111011010 | 1000100101 |
| 110 | 01101110 | 0111110010 | 1000001101 |
| 111 | 01101111 | 0100111110 | 1011000001 |
| 112 | 01110000 | 0011011110 | 1100100001 |
| 113 | 01110001 | 1100011110 | 0011100001 |
| 114 | 01110010 | 1101101100 | 0010010011 |
| 115 | 01110011 | 0101111010 | 1010000101 |
| 116 | 01110100 | 1001111001 | 0110000110 |
| 117 | 01110101 | 0011111001 | 1100000110 |
| 118 | 01110110 | 1110000111 | 0001111000 |
| 119 | 01110111 | 0111101100 | 1000010011 |
| 120 | 01111000 | 0111101001 | 1000010110 |
| 121 | 01111001 | 0011110110 | 1100001001 |
| 122 | 01111010 | 1011110100 | 0100001011 |
| 123 | 01111011 | 0110011110 | 1001100001 |
| 124 | 01111100 | 1001011110 | 0110100001 |
| 125 | 01111101 | 1011110001 | 0100001110 |
| 126 | 01111110 | 0001111011 | 1110000100 |
| 127 | 01111111 | 0010111101 | 1101000010 |
| 128 | 10000000 | 0111100110 | 1000011001 |
| 129 | 10000001 | 1100111100 | 0011000011 |
| 130 | 10000010 | 1101111000 | 0010000111 |
| 131 | 10000011 | 0111100011 | 1000011100 |
| 132 | 10000100 | 0110111100 | 1001000011 |
| 133 | 10000101 | 1000111101 | 0111000010 |
| 134 | 10000110 | 0001111110 | 1110000001 |
| 135 | 10000111 | 0011111100 | 1100000011 |
| 136 | 10001000 | 0111111000 | 1000000111 |
| 137 | 10001001 | 0001101011 | 1101010001 |
| 138 | 10001010 | 0110111000 | 1101000101 |
| 139 | 10001011 | 1000111001 | 1101010100 |
| 140 | 10001100 | 1000110110 | 0001110101 |
| 141 | 10001101 | 0111001010 | 0101110100 |
| 142 | 10001110 | 1000110011 | 0101011100 |
| 143 | 10001111 | 1000101101 | 0100010111 |
| 144 | 10010000 | 1000100111 | 0101000111 |
| 145 | 10010001 | 1000011110 | 0101100101 |
| 146 | 10010010 | 0001111010 | 0110010101 |
| 147 | 10010011 | 1100001110 | 0111010001 |
| 148 | 10010100 | 0111100010 | 0101010011 |
| 149 | 10010101 | 0010111100 | 0101010110 |
| 150 | 10010110 | 1011100001 | 0111010100 |
| 151 | 10010111 | 0010011110 | 0101110001 |
| 152 | 10011000 | 1011000011 | 0100011101 |
| 153 | 10011001 | 1000011011 | 0011010101 |
| 154 | 10011010 | 1010000111 | 1100010101 |
| 155 | 10011011 | 1001111000 | 0001010111 |
| 156 | 10011100 | 1000111100 | 1001010101 |
| 157 | 10011101 | 1110000011 | 0100110101 |
| 158 | 10011110 | 1110100001 | 0101001101 |
| 159 | 10011111 | 1110000110 | 0111000101 |

FIG. 4D

| | | | | | |
|---|---|---|---|---|---|
| 160 | 10100000 | 0010011011 | 0101011001 | | |
| 161 | 10100001 | 0010101110 | 1110010100 | | |
| 162 | 10100010 | 0010111010 | 1001000111 | | |
| 163 | 10100011 | 0010101011 | 0111000110 | | |
| 164 | 10100100 | 1110001010 | 0111001001 | | |
| 165 | 10100101 | 1010001011 | 1000110101 | | |
| 166 | 10100110 | 1010100011 | 0111001100 | | |
| 167 | 10100111 | 1011101000 | 0111010010 | | |
| 168 | 10101000 | 1010111000 | 0111011000 | | |
| 169 | 10101001 | 1010011010 | 0111100001 | | |
| 170 | 10101010 | 1001101010 | 1110000101 | | |
| 171 | 10101011 | 1000101110 | 0011110001 | | |
| 172 | 10101100 | 1010101100 | 1000011101 | | |
| 173 | 10101101 | 1010101001 | 1101000011 | | |
| 174 | 10101110 | 1000101011 | 0100011110 | | |
| 175 | 10101111 | 1010001110 | 1101100001 | | |
| 176 | 10110000 | 1011100010 | 0100111100 | | |
| 177 | 10110001 | 1100101010 | 0111100100 | | |
| 178 | 10110010 | 0011101010 | 0101111000 | | |
| 179 | 10110011 | 1110101000 | 0110000111 | | |
| 180 | 10110100 | 0110101010 | 0111000011 | | |
| 181 | 10110101 | 1011001010 | 0001111100 | | |
| 182 | 10110110 | 1010110010 | 0001011110 | | |
| 183 | 10110111 | 1000111010 | 0001111001 | | |
| 184 | 10111000 | 1010100110 | 1101100100 | | |
| 185 | 10111001 | 1101101010 | 0010010101 | 1101101101 | 0010010010 |
| 186 | 10111010 | 1100101011 | 0011010100 | 1101011011 | 0010100100 |
| 187 | 10111011 | 1011011010 | 0100100101 | 1110010111 | 0001101000 |
| 188 | 10111100 | 1011001011 | 0100110100 | 0111100111 | 1000011000 |
| 189 | 10111101 | 1010110110 | 0101001001 | 1101110011 | 0010001100 |
| 190 | 10111110 | 1010110011 | 0101001100 | 1110110101 | 0001001010 |
| 191 | 10111111 | 1010101101 | 0101010010 | 1101100111 | 0010011000 |
| 192 | 11000000 | 1010011011 | 0101100100 | 1110011101 | 0001100010 |
| 193 | 11000001 | 1001101011 | 0110010100 | 1100110111 | 0011001000 |
| 194 | 11000010 | 0110101011 | 1001010100 | 1011011101 | 0100100010 |
| 195 | 11000011 | 0010111011 | 1101000100 | 1011010111 | 0100101000 |
| 196 | 11000100 | 1100111010 | 0011000101 | 1001110111 | 0110001000 |
| 197 | 11000101 | 1100101110 | 0011010001 | 1011110101 | 0100001010 |
| 198 | 11000110 | 1110110010 | 0001001101 | 0111011011 | 1000100100 |
| 199 | 11000111 | 0011101011 | 1100010100 | 1101011110 | 0010100001 |
| 200 | 11001000 | 0011101110 | 1100010001 | 1001111101 | 0110000010 |
| 201 | 11001001 | 1011101100 | 0100010011 | 1101110110 | 0010001001 |
| 202 | 11001010 | 1011101001 | 0100010110 | 1100111101 | 0011000010 |
| 203 | 11001011 | 1011100110 | 0100011001 | 1101111100 | 0010000011 |
| 204 | 11001100 | 1010011110 | 0101100001 | 0111111001 | 1000000110 |
| 205 | 11001101 | 1011100011 | 0100011100 | 1101111001 | 0010000110 |
| 206 | 11001110 | 1110101100 | 0001010011 | 0101111011 | 1010000100 |
| 207 | 11001111 | 1011001110 | 0100110001 | 0011110111 | 1100001000 |
| 208 | 11010000 | 1110101001 | 0001010110 | 0111011110 | 1000100001 |
| 209 | 11010001 | 1010111001 | 0101000110 | 0011111101 | 1100000010 |
| 210 | 11010010 | 1110100110 | 0001011001 | 0101111110 | 1010000001 |
| 211 | 11010011 | 1110100011 | 0001011100 | 0110110111 | 1001001000 |
| 212 | 11010100 | 1110011010 | 0001100101 | 0111101101 | 1000010010 |
| 213 | 11010101 | 1010100111 | 0101011000 | 0110111101 | 1001000010 |
| 214 | 11010110 | 1110001110 | 0001110001 | 0111110110 | 1000001001 |

FIG. 4E

| | | | | | |
|---|---|---|---|---|---|
| 215 | 11010111 | 1001101110 | 0110010001 | 0111110011 | 1000001100 |
| 216 | 11011000 | 1101100101 | 0010011010 | 1101101011 | 0010010100 |
| 217 | 11011001 | 1101011001 | 0010100110 | 1011011011 | 0100100100 |
| 218 | 11011010 | 1101010110 | 0010101001 | 1110110011 | 0001001100 |
| 219 | 11011011 | 1101010011 | 0010101100 | 1110101101 | 0001010010 |
| 220 | 11011100 | 1101001101 | 0010110010 | 1110100111 | 0001011000 |
| 221 | 11011101 | 1100110101 | 0011001010 | 1110011011 | 0001100100 |
| 222 | 11011110 | 1011010101 | 0100101010 | 1101101110 | 0010010001 |
| 223 | 11011111 | 0101011011 | 1010100100 | 1110111001 | 0001000110 |
| 224 | 11100000 | 0101101101 | 1010010010 | 1100111011 | 0011000100 |
| 225 | 11100001 | 0110110101 | 1001001010 | 1011101101 | 0100010010 |
| 226 | 11100010 | 1101000111 | 0010111000 | 1011100111 | 0100011000 |
| 227 | 11100011 | 1101011100 | 0010100011 | 1110110110 | 0001001001 |
| 228 | 11100100 | 0011010111 | 1100101000 | 1010110111 | 0101001000 |
| 229 | 11100101 | 0011011101 | 1100100010 | 1010111101 | 0101000010 |
| 230 | 11100110 | 1100011101 | 0011100010 | 1110111100 | 0001000011 |
| 231 | 11100111 | 1100010111 | 0011101000 | 1110011110 | 0001100001 |
| 232 | 11101000 | 0001110111 | 1110001000 | 1101111010 | 0010000101 |
| 233 | 11101001 | 0100110111 | 1011001000 | 1001111110 | 0110000001 |
| 234 | 11101010 | 1101110100 | 0010001011 | 1011110110 | 0100001001 |
| 235 | 11101011 | 1101110001 | 0010001110 | 1011111001 | 0100000110 |
| 236 | 11101100 | 0101110011 | 1010001100 | 1011011110 | 0100100001 |
| 237 | 11101101 | 0101110110 | 1010001001 | 0111101011 | 1000010100 |
| 238 | 11101110 | 1001110101 | 0110001010 | 0111101110 | 1000010001 |
| 239 | 11101111 | 0110010111 | 1001101000 | 0110111011 | 1001000100 |
| 240 | 11110000 | 0110011101 | 1001100010 | 0110111110 | 1001000001 |
| 241 | 11110001 | 1001011101 | 0110100010 | 1001111011 | 0110000100 |
| 242 | 11110010 | 1001010111 | 0110101000 | 1011111100 | 0100000011 |
| 243 | 11110011 | 1110010101 | 0001101010 | 1011110011 | 0100001100 |
| 244 | 11110100 | 0111000111 | 1000111000 | 0011111011 | 1100000100 |
| 245 | 11110101 | 1110001011 | 0001110100 | 0111001101 | 1000110010 |
| 246 | 11110110 | 1110111000 | 0001000111 | 0111010011 | 1000101100 |
| 247 | 11110111 | 0110101110 | 1001010001 | 0111010110 | 1000101001 |
| 248 | 11111000 | 0110111010 | 1001000101 | 0111011001 | 1000100110 |
| 249 | 11111001 | 1000111011 | 0111000100 | 0111011100 | 1000100011 |
| 250 | 11111010 | 1001111010 | 0110000101 | 0001111101 | 1110000010 |
| 251 | 11111011 | 1000111110 | 0111000001 | 0111110100 | 1000001011 |
| 252 | 11111100 | 1010111100 | 0101000011 | 0100111101 | 1011000010 |
| 253 | 11111101 | 1011111000 | 0100000111 | 0101111001 | 1010000110 |
| 254 | 11111110 | 1011110010 | 0100001101 | 0101111100 | 1010000011 |
| 255 | 11111111 | 0111101010 | 1000010101 | 0111100101 | 1000011010 |

FIG. 5

Data group Aa = 0 ~ 57 (N=58)

| state | s0 | s1 | s2 | s3 | s4 | s5 | s6 | s7 | s8 | s9 | s10 | s11 |
|---|---|---|---|---|---|---|---|---|---|---|---|---|
| A_L |  |  |  | 0 | 1 | 2 |  |  |  | 6 | 7 | 8 |
| A_R | 3 | 4 | 5 |  |  |  | 9 | 10 | 11 |  |  |  |

Data group Ab = 59 ~ 136 (N=79)

| state | s0 | s1 | s2 | s3 | s4 | s5 | s6 | s7 | s8 | s9 | s10 | s11 |
|---|---|---|---|---|---|---|---|---|---|---|---|---|
| A_L | 1 | 2 |  | 4 | 5 |  | 7 |  |  |  | 10 |  |
| A_R |  |  | 1 |  |  | 4 |  | 6 | 7 |  | 9 | 10 |

Data group Ac = 137 ~ 160 (N=24 )

| state | s0 | s1 | s2 | s3 | s4 | s5 | s6 | s7 | s8 | s9 | s10 | s11 |
|---|---|---|---|---|---|---|---|---|---|---|---|---|
| A_L |  |  |  | 0 | 1 | 2 | 3 | 4 | 5 | 6 | 7 | 8 |
| A_R | 9 | 10 | 11 |  |  |  |  |  |  |  |  |  |

FIG. 6

Data group Ad = 161 ~ 184 (N=24)

| state | s0 | s1 | s2 | s3 | s4 | s5 | s6 | s7 | s8 | s9 | s10 | s11 |
|---|---|---|---|---|---|---|---|---|---|---|---|---|
| A_L |  |  |  |  |  |  |  |  |  | 0 | 1 | 2 |
| A_R | 3 | 4 | 5 | 6 | 7 | 8 | 9 | 10 | 11 |  |  |  |

Data group Ba = 185 ~ 215 (N=31)

| state | s0 | s1 | s2 | s3 | s4 | s5 | s6 | s7 | s8 | s9 | s10 | s11 |
|---|---|---|---|---|---|---|---|---|---|---|---|---|
| A_L |  |  |  |  |  |  |  | 2 |  |  | 4 | 5 |
| A_R |  | 6 | 7 |  | 9 |  |  |  |  |  |  |  |

| state | s0 | s1 | s2 | s3 | s4 | s5 | s6 | s7 | s8 | s9 | s10 | s11 |
|---|---|---|---|---|---|---|---|---|---|---|---|---|
| B_L | 5 |  |  | 8 |  |  | 11 |  |  |  |  |  |
| B_R |  |  |  |  |  | 0 |  |  | 3 |  |  | 6 |

FIG. 7

Data group Bb = 216 ~ 244 (N=29)

| state | s0 | s1 | s2 | s3 | s4 | s5 | s6 | s7 | s8 | s9 | s10 | s11 |
|---|---|---|---|---|---|---|---|---|---|---|---|---|
| A_L | 7 | 8 | | | 11 | | | | | | | |
| A_R | | | | | | | | 0 | | | 3 | 4 |

| state | s0 | s1 | s2 | s3 | s4 | s5 | s6 | s7 | s8 | s9 | s10 | s11 |
|---|---|---|---|---|---|---|---|---|---|---|---|---|
| B_L | | | 2 | | | 5 | | | 8 | | | |
| B_R | | | | 3 | | | 6 | | | 9 | | |

Data group Bc = 245 ~ 255 (N=11)

| state | s0 | s1 | s2 | s3 | s4 | s5 | s6 | s7 | s8 | s9 | s10 | s11 |
|---|---|---|---|---|---|---|---|---|---|---|---|---|
| A_L | | | | | | | 1 | 2 | | 4 | 5 | |
| A_R | | 6 | 7 | | 9 | 10 | | | | | | |

| state | s0 | s1 | s2 | s3 | s4 | s5 | s6 | s7 | s8 | s9 | s10 | s11 |
|---|---|---|---|---|---|---|---|---|---|---|---|---|
| B_L | 7 | | | 10 | | | | | | | | |
| B_R | | | | | | | | | | 1 | | 4 |

FIG. 8

IDLE code = -K28.7 / +K28.7

| state | s0 | s1 | s2 | s3 | s4 | s5 | s6 | s7 | s8 | s9 | s10 | s11 |
|---|---|---|---|---|---|---|---|---|---|---|---|---|
| 0011111000 | | | | 0 | 1 | 2 | | | | 6 | 7 | 8 |
| 1100000111 | 3 | 4 | 5 | | | | | 9 | 10 | 11 | | |

Skip control = +K28.0 / -K28.0

| state | s0 | s1 | s2 | s3 | s4 | s5 | s6 | s7 | s8 | s9 | s10 | s11 |
|---|---|---|---|---|---|---|---|---|---|---|---|---|
| 1100001011 | | | | 0 | 1 | 2 | | | | 6 | 7 | 8 |
| 0011110100 | 3 | 4 | 5 | | | | | 9 | 10 | 11 | | |

Align control = +K28.3 / -K28.3

| state | s0 | s1 | s2 | s3 | s4 | s5 | s6 | s7 | s8 | s9 | s10 | s11 |
|---|---|---|---|---|---|---|---|---|---|---|---|---|
| 1100001011 | 1 | 2 | | 4 | 5 | | 7 | | | 10 | | |
| 0011110100 | | 1 | | | 4 | | 6 | 7 | | 9 | 10 | |

FIG. 9

Fault control = -K28.4 / +K28.4

| state | s0 | s1 | s2 | s3 | s4 | s5 | s6 | s7 | s8 | s9 | s10 | s11 |
|---|---|---|---|---|---|---|---|---|---|---|---|---|
| 0011110010 | | | | 0 | 1 | 2 | | | | 6 | 7 | 8 |
| 1100001101 | 3 | 4 | 5 | | | | 9 | 10 | 11 | | | |

Frame start = -K27.7 / +K27.7

| state | s0 | s1 | s2 | s3 | s4 | s5 | s6 | s7 | s8 | s9 | s10 | s11 |
|---|---|---|---|---|---|---|---|---|---|---|---|---|
| 1101101000 | | | | 0 | 1 | 2 | | | | 6 | 7 | 8 |
| 0010010111 | 3 | 4 | 5 | | | | 9 | 10 | 11 | | | |

Frame end = +K29.7 / -K29.7

| state | s0 | s1 | s2 | s3 | s4 | s5 | s6 | s7 | s8 | s9 | s10 | s11 |
|---|---|---|---|---|---|---|---|---|---|---|---|---|
| 1100111000 | | | | 0 | 1 | 2 | | | | 6 | 7 | 8 |
| 0011000111 | 3 | 4 | 5 | | | | 9 | 10 | 11 | | | |

Error control = -K30.7 / +K30.7

| state | s0 | s1 | s2 | s3 | s4 | s5 | s6 | s7 | s8 | s9 | s10 | s11 |
|---|---|---|---|---|---|---|---|---|---|---|---|---|
| 0111101000 | | | | 0 | 1 | 2 | | | | 6 | 7 | 8 |
| 1000010111 | 3 | 4 | 5 | | | | 9 | 10 | 11 | | | |

Code group Ca = 256 ~ 257 (N=2)

| state | s0 | s1 | s2 | s3 | s4 | s5 | s6 | s7 | s8 | s9 | s10 | s11 |
|---|---|---|---|---|---|---|---|---|---|---|---|---|
| A_L |  |  |  |  |  |  | 1 | 2 |  | 4 | 5 |  |
| A_R |  | 6 | 7 |  | 9 | 10 |  |  |  |  |  |  |

| state | s0 | s1 | s2 | s3 | s4 | s5 | s6 | s7 | s8 | s9 | s10 | s11 |
|---|---|---|---|---|---|---|---|---|---|---|---|---|
| B_L | 7 |  |  | 10 |  |  |  |  |  |  |  |  |
| B_R |  |  |  |  |  |  |  |  |  | 1 |  | 4 |

Code group Cb = 258 ~ 259 (N=2)

| state | s0 | s1 | s2 | s3 | s4 | s5 | s6 | s7 | s8 | s9 | s10 | s11 |
|---|---|---|---|---|---|---|---|---|---|---|---|---|
| A_L |  |  |  | 0 | 1 | 2 |  |  |  | 6 | 7 | 8 |
| A_R | 3 | 4 | 5 |  |  |  |  | 9 | 10 | 11 |  |  |

| state | s0 | s1 | s2 | s3 | s4 | s5 | s6 | s7 | s8 | s9 | s10 | s11 |
|---|---|---|---|---|---|---|---|---|---|---|---|---|
| B_L* |  |  |  | 0 | 1 | 2 |  |  |  | 6 | 7 | 8 |
| B_R* | 3 | 4 | 5 |  |  |  |  | 9 | 10 | 11 |  |  |

MB810 ENCODER/DECODER, DUAL MODE ENCODER/DECODER, AND MB810 CODE GENERATING METHOD

This application claims priority from Korean Patent Application No. 2003-48426, filed on Jul. 15, 2003, the contents of which are incorporated herein by reference in their entirety.

BACKGROUND OF THE INVENTION

1. Field of the Invention

The present invention relates to an MB810 encoder and/or decoder, a dual mode encoder and/or decoder, and an MB810 code generation method, and more particularly, to an MB810 encoder and/or decoder, a dual mode encoder and/or decoder, and an MB810 code generation method using control codes satisfying conditions of a DC-free code and spectrum 0 at Nyquist frequency.

2. Description of the Related Art

When data is to be encoded into codes and transmitted, it should be first guaranteed due to the characteristic of transmission lines that the condition of a DC-free code is satisfied. A lot of research projects have been focused on generation methods of this DC-free code. Also, it has been known that in order to transmit data at a high speed, a smaller transmission bandwidth that is required to encoded codes is more advantageous than a larger bandwidth and theoretically the minimum bandwidth desired to be transmitted should have spectral null at the Nyquist frequency. In an article, "A condition for stable minimum-bandwidth line codes", published in IEEE Trans. on Comm., Vol. COM-33, No. 2, pp 152-157, February 1985, the rationale of the condition that in addition to the DC-free condition, the spectrum should also be 0 at the Nyquist frequency is theoretically analyzed. Also, in an article, "DC-free and Nyquist-free error correcting convolutional codes", published in Electronics Letters, Vol. 32, No. 24, pp 2196-2198, November, 1996, a (4, 3) code satisfying the conditions described above is suggested.

Meanwhile, U.S. Pat. No. 4,486,739 discloses a method in which a 5B/6B coder and a 3B/4B coder are combined to generate an 8B/10B coder to limit a run length, and based on 8-bit data, 10-bit code and control codes (align, skip, comma, etc.) required for transmission of the generated code are generated. However, though the codes generated by this method are DC-free codes, those are not minimum bandwidth codes.

U.S. Pat. No. 5,663,724 discloses a method in which by a 16B/20B encoder implemented by placing two 8B/10B encoders in parallel in order to apply the method of U.S. Pat. No. 4,486,739 to fiber channels, an upper 3B/4B encoder controls the disparity of a lower 5B/6B encoder and a lower 3B/4B encoder controls the disparity of an upper 5B/6B encoder of the next word. However, since the encoder suggested in the U.S. Pat. No. 5,663,724 is also an 8B/10B encoder in essence, the codes generated by the encoder are DC-free codes but not minimum bandwidth codes.

Also, U.S. Pat. No. 6,501,396 discloses a method in which in order to solve the shortcoming of the U.S. Pat. No. 5,663,724 that the number of encoders connected in parallel is limited to 2, a block to control disparity is separately implemented to control disparity in each channel. Though this method solves the problem of the limited number of channels capable of transmitting data in parallel, the codes generated by the encoder are also DC-free codes but not minimum bandwidth codes.

U.S. Pat. No. 6,425,107 discloses a method in which in order to more simply implement an encoder in encoding 8 bits into 10 bits, all possible balanced (equal number of logic 0 and logic 1 bits) 10-bit codes are selected to obtain 256 entries, and if there are less than 256 entries, imbalanced 10-bit codes which are imbalanced by 2 bits or less are used. However, the codes generated by this method are also DC-free but not minimum bandwidth codes.

Also, U.S. Pat. No. 6,441,756 discloses an 8B/14B code formed with a control code group separate from a data conversion code group in order to increase the probability of DC suppression. However, the codes suggested here are also DC-free codes but not minimum bandwidth codes.

Meanwhile, U.S. Pat. No. 6,362,757 discloses MB810-line code generation method and structure. The method disclosed by the U.S. Pat. No. 6,362,757 can generate minimum bandwidth codes capable of generating spectral null even at the Nyquist frequency, as well as DC-free codes, but has some problems when practically applied. First, there is a code whose run length (that is, the number of contiguous 0's or 1's) is 7 in the code itself. Also, there is a danger that run length exceeds 7 due to neighboring codes when 10-bit codes are transmitted. At this time, the worst case that the run length is 9 may occur. Accordingly, in the MB810 line code generation method and structure disclosed in the U.S. Pat. No. 6,362,757, it is difficult to utilize the clock extraction circuit used in the conventional 8B/10B codes. Also, since a code (comma code) for distinguishing frames used in the conventional 8B/10B encoder is included in a data code and there is no specific mention on the code (comma code) for distinguishing frames, it is difficult to use this method in a dual mode operation in which an 8B/10B encoder and an MB810 encoder are embedded and a user selects one encoder.

Also, Korean Patent Laying-Open No. 2003-0020519 discloses a method to enable dual mode use of the conventional 8B/10B coder and MB810 coder in order to complement the method of U.S. Pat. No. 6,362,757. This method uses codes /A/, /K/, /R/, as IDLE code group, in order to determine whether a received code is an 8B/10B code or an MB810 code. However, in order to use this method, the structures of 8B/10B encoders and decoders widely used at present should be changed.

SUMMARY OF THE INVENTION

The present invention provides an MB810 encoder and/or decoder capable of utilizing a clock extraction circuit used in the prior art 8B/10B code method by reducing a run length to 6 or less, a dual mode encoder and/or decoder capable of selectively using MB810 encoder and/or decoder without changing the structure of the prior art 8B/10B encoder and/or decoder, and an MB810 code generation method having a reduced transmission bandwidth compared to the prior art 8B/10B codes.

According to an aspect of the present invention, there is provided an MB810 code generation method comprising: forming 12 state points in the form of a 4×3 matrix on a state transition map formed with binary unit digital sum variation & alternate sum variation (BUDA) to generate a 10-bit code from 8-bit data; outputting a 10-bit code from a predetermined state point forming the matrix; selecting codes forming a complementary pair from a set of codes capable of arriving at state points forming the matrix; selecting codes forming the 12 state points by supplementing state points lacked in the codes forming a complementary pair; selecting control codes including IDLE code from the codes forming the 12 state points; and removing codes generating the IDLE code by a bit string between neighboring codes among the codes forming the 12 state points.

According to another aspect of the present invention, there is provided an MB810 encoder comprising: a table storage unit which stores code tables having data codes written therein, the data codes generated by forming 12 state points in the form of a 4×3 matrix on a state transition map formed with binary unit digital sum variation & alternate sum variation (BUDA) to generate a 10-bit code from 8-bit data, and outputting a 10-bit code from a predetermined state point forming the matrix, and then, supplementing second codes having state points lacked in first codes forming complementary pairs selected from a set of 10-bit codes capable of arriving at state points forming the matrix, and then, selecting control codes including IDLE code among the first and second codes, and removing codes generating the IDLE code by a bit string between neighboring codes among the second codes, and codes that are selected as the control codes; a first buffer unit which stores an 8-bit control code input from the outside; a second buffer unit which stores an 8-bit control code input from the outside; and a state transition unit which, based on a current state and the contents of the 8-bit data code input from the first buffer unit, reads out a 10-bit data code from a code table stored in the table storage unit and outputs the code, and, based on a current state and the contents of the 8-bit control code input from the second buffer unit, reads out a 10-bit control code from a code table stored in the table storage unit, and based on predetermined state transition information, is transited to one of 12 state points on the state transition map.

According to still another aspect of the present invention, there is provided an MB810 decoder comprising: a table storage unit which stores code tables having data codes written therein, the data codes generated by forming 12 state points in the form of a 4×3 matrix on a state transition map formed with binary unit digital sum variation & alternate sum variation (BUDA) to generate a 10-bit code from 8-bit data, and outputting a 10-bit code from a predetermined state point forming the matrix, and then, supplementing second codes having state points lacked in first codes forming complementary pairs selected from a set of 10-bit codes capable of arriving at state points forming the matrix, and then, selecting control codes including IDLE code among the first and second codes, and removing codes generating the IDLE code by a bit string between neighboring codes among the second codes, and codes that are selected as the control codes; a decoding unit which based on the contents of a 10-bit code input from the outside, reads out an 8-bit data code or an 8-bit control code from a code table stored in the table storage unit; a first buffer unit which stores the 8-bit data code input from the decoding unit and then outputs the code to the outside; and a second buffer unit which stores the 8-bit control code input from the decoding unit and then outputs the code to the outside.

According to yet still another aspect of the present invention, there is provided a dual mode encoder comprising: an MB810 encoder; an 8B/10B encoder; a determination unit which determines an encoder to be used as an operation encoder between the MB810 encoder and the 8B/10B encoder; a first selection unit which provides an 8-bit code input from the outside to the encoder determined as the operation encoder; a second selection unit which receives a 10-bit code corresponding to the 8-bit code from the encoder determined as the operation encoder, and outputs the code; a serial conversion unit which converts the 10-bit code input from the second selection unit into a 10-bit serial code; a code clock generation unit which receives a data clock from the outside, generates a code clock, and provides the clock signal to the serial conversion unit; a first low pass filter which when the MB810 encoder is determined as the operation encoder, removes a predetermined frequency bandwidth from a 10-bit serial code input from the serial conversion unit; a first amplifier which amplifies a 10-bit serial code input from the first low pass filter and outputs the code; a second low pass filter which when the 8B/10B encoder is determined as the operation encoder, removes a predetermined frequency bandwidth from a 10-bit serial code input from the serial conversion unit; a second amplifier which amplifies a 10-bit serial code input from the second low pass filter and outputs the code; and a switch unit which according to the encoder determined as the operation encoder, provides a 10-bit serial code output from the serial conversion unit selectively to the first and second low pass filters, and selectively outputs a 10-bit serial code output from the first and second amplifiers to the outside.

According to a further aspect of the present invention, there is provided a dual mode decoder comprising: an MB810 decoder; an 8B/10B decoder; a mode detection unit which detects a decoder to be used as an operation decoder between the MB810 decoder and the 8B/10B decoder; a first low pass filter which when the MB810 decoder is determined as the operation decoder, removes a predetermined frequency bandwidth from a 10-bit code input from the outside; a second low pass filter which when the 8B/10B decoder is determined as the operation decoder, removes a predetermined frequency bandwidth from a 10-bit code input from the outside; an IDLE code detection unit which detects IDLE code from the 10-bit code and transfers to the mode detection unit; a first switch unit which according to the decoder determined as the operation decoder, selectively outputs the 10-bit code input from the first low pass filter and the second low pass filter; a parallel conversion unit which converts the 10-bit code input from the first switch into a parallel code and outputs a 10-bit parallel code; a first selection unit which provides the 10-bit parallel code to the decoder determined as the operation decoder between the MB810 decoder and the 8B/10B decoder; and a second selection unit which selectively outputs an 8-bit code corresponding to the 10-bit parallel code input from the decoder determined as the operation decoder.

According to the apparatuses and method, the transmission bandwidth is reduced compared to the prior art 8B/10B codes such that long distance transmission is enabled, and without changing the prior art 8B/10B coding method, the codes are applied together with MB810 codes such that the dual mode operation can be performed in which a user can select a desired line code.

BRIEF DESCRIPTION OF THE DRAWINGS

The above objects and advantages of the present invention will become more apparent by describing in detail preferred embodiments thereof with reference to the attached drawings in which:

FIGS. 2a through 2f are diagrams of code tables in which codes used in an MB810 encoder according to the present invention are recorded;

FIG. 3 is a diagram of a code table in which codes that can be internally used in the MB810 according to the present invention are recorded;

FIGS. 4a through 4e are diagrams of code tables in which codes used in an MB810 decoder according to the present invention are recorded;

FIGS. 5 through 7 are diagrams of tables in which state transition information related to operations of MB810 encoder when encoding 8-bit data information according to the present invention is recorded;

FIGS. 8 through 10 are diagrams of tables in which state transition information related to operations of the MB810 encoder when encoding 8-bit control information according to the present invention is recorded;

FIG. 11 is a diagram showing the power spectrum of an 8B/10B line code;

DESCRIPTION OF THE PREFERRED EMBODIMENTS

Hereinafter, the present invention will be described in detail by explaining preferred embodiments of an improved MB810 line code apparatus including control codes and an MB810 code generation method according to the present invention with reference to the attached drawings.

Figure 1:
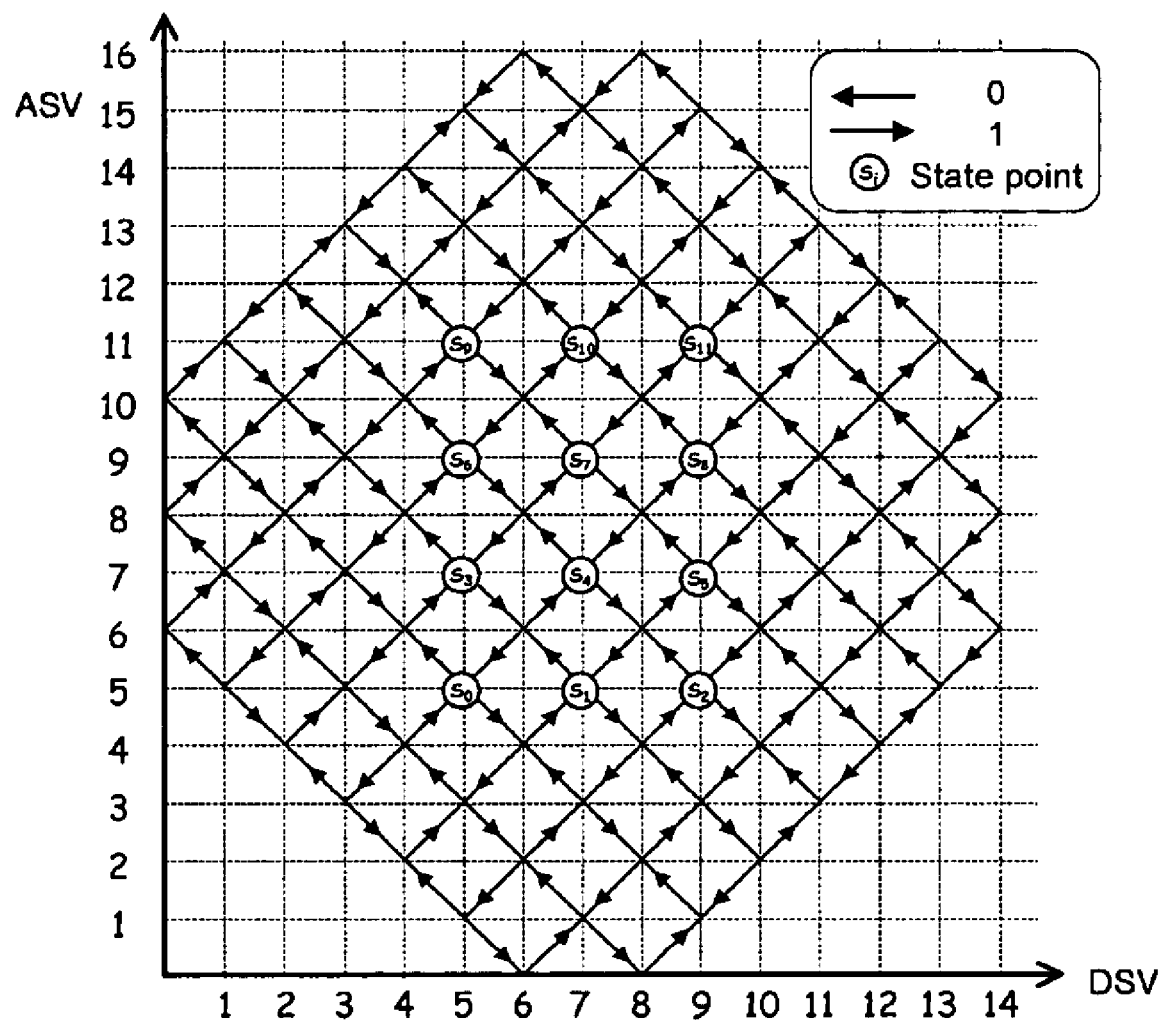
FIG. 1 is a state transition map showing a binary unit digital sum variation & alternate sum variation (BUDA) stack for generating MB810 codes according to the present invention and 12 state points.

Referring to FIG. 1, s0, . . . , s11 denote respective state points of an MB810 encoder and a group of state points are set in the form of a 4×3 matrix. Arrows shown in FIG. 1 indicate paths through which an MB810 encoder can change according to the output of a 10-bit code converted corresponding to data input to the encoder when the MB810 encoder is in each state point. If the sign of output bits is 0, the state moves to the left by one arrow, and if the sign of output bits is 1, the state moves to the right by one arrow. Since the number of output bits is 10, the state moves along 10 arrows according to the sign of the code. A method for selecting a code on this state transition map will now be explained.

First, after a 10-bit code is output from an arbitrary state point among s0, . . . , s11, only those codes that can reach any one state point of s0, . . . , s11 are useful codes having minimum bandwidths and therefore those codes can be set as valid codes. The number of valid codes among 1024 codes is 890.

Next, in selecting IDLE code, in order to easily distinguish from 8B/10B codes when the encoder operates in dual mode, IEEE 802.3 standard K28.7 (0011111000 and 1100000111) which embeds a comma among those codes that are not used by 8B/10B codes is selected, and removed from candidate lists for data codes and control codes.

Then, codes whose run length exceeds 6 (for example, in the case of 1011011110, the run length is 4) are removed among the output codes. In case when the run length exceeds 6 by a neighboring code, the code having a longer run length is removed. That is, if the preceding code is 1011001111 and the succeeding code is 1110010111, 1011001111 is removed from the candidate list.

After combining all the remaining codes into complementary pairs, code combinations according to state transitions of these pairs are generated continuously three times. Then, among the generated code combinations, those code combinations that cause −K28.7 to occur immediately after +K28.7 or +K28.7 to occur immediately after −K28.7 are collected and code pairs providing such code combinations are removed from the candidate list.

Next, by using the characteristic that an encoder necessarily returns to a starting state point according to state transitions, complementary code pairs that make the highest number of complementary code pairs as possible are selected when these code pairs are selected.

Next, codes that can travel all state points only with one complementary code pair (that is, only with two codes) among the selected complementary code pairs are selected. All 161 pairs are selected as these codes.

Next, among the selected complementary code pairs, K28.0, K28.3, K28.4, K27.7 and K20.7 codes that are 8B/10B control codes defined in IEEE 802.3ae are selected as MB810 control codes with the same function as the control function of 8B/10B codes. Among the existing 8B/10B control codes, only with one code pair, K29.7 code is short of the number of states such that it is difficult to make a code combination having a minimum bandwidth when K29.7 code is used as a control code having the same function even in the MB810 code. Accordingly, another code pair capable of traveling lacked state points should be added or the code should be replaced by a code capable of traveling all state points only with one code pair. For simplification of control function operation, one code pair, 1100111000 and 001100011, is used as K29.7 of MB810 code.

Next, code combinations that can travel all state points with two pairs (that is, four codes) are selected. The number of combinations in which thus selected two pairs are assigned to data is 73 (that is, 73×4=292 codes).

Next, by combining 24 codes having only state points of s0, s1 and s2 with 24 codes having state points of s3, s4, s5, s6, s7, s8, s9, s10, and s11 (that is, 9 state transition points) among the 161 pairs having state transitions selected above, 24 code pairs are selected.

Also, by combining 24 codes having only state points of s9, s10 and s11 with 24 codes having state points of s0, s1, s2, s3, s4, s5, s6, s7, and s8 (that is, 9 state transition points) among the 161 pairs having state transitions selected above, 24 code pairs are selected.

Finally, among codes having 9 state points and not included in the 161 pairs selected above, complementary pairs whose run length is 4 and whose bit shapes are 1111XXXXXX and 0000XXXXXX (X is 0 or 1) are combined into two pairs each. That is, it is made to be possible to output a different code according to the shape of final bits of a code output immediately before. Thus selected two code pairs are two kinds and include 1111001000, 0000110111, 000011101 and 1111000100, and 1111000010, 000011111101, 0000111110, and 1111000001.

Since thus the number of selected code pairs is 260, 256 pairs are assigned to data and the remaining four pairs can be used for special purposes internally in the MB810 coder, such as state synchronization of physical coding sublayer (PCS: physical coding lower layer defined in IEEE 802.3 standard), transmission of state information from an encoder to a decoder during IDLE cycle, and transmission of state information from an encoder to a decoder before data frame start.

MB810 codes generated by the above method are shown in FIGS. 2*a* through 3*e*. Codes shown in FIGS. 2*a* through 2*f* are those codes that are used by an MB810 encoder and forming 7 groups. Codes shown in FIG. 3 are those codes that can be internally used in an MB810 encoder and state information that can be output for each data item is shown together. Codes shown in FIGS. 4*a* through 4*e* are those codes that are used by an MB810 decoder. Since the decoder does not need state information when decoding data, state information is not written in FIGS. 4*a* through 4*e*.

Meanwhile, FIGS. 5 through 10 are tables in which codes and/or state information related to encoding operations of an MB810 encoder are written.

First, IDLE codes (that is, +K28.7/−K28.7) shown in FIG. 8 are those code that are always transmitted when data is not transmitted. In FIG. 8, s0, s1, . . . , s11 indicate states of an MB810 encoder, and in spaces below s0, s1, . . . , s11 columns, state information to which the encoder is transited after a corresponding code is transmitted is written. In case where state information is not written, a corresponding code is not transmitted and the code in the row of the space where state information is located is output. Accordingly, if the state when IDLE code is desired to be transmitted is s0, the MB810 encoder outputs 1100000111 (that is, +K28.7) and is transited to s3 state. Also, if IDLE code is continuously transmitted, 0011111000 (that is, −K28.7) is output and the encoder is transited to s0 state.

If the state when IDLE code is desired to be transmitted is s7, the MB810 encoder outputs 1100000111 (that is, +K28.7) and is transited to s10 state. Also, if IDLE code is continuously transmitted, 0011111000 (that is, −K28.7) is output and the encoder is transited to s7 state. The codes in the second table of FIG. 8 are those codes that are used when skip control information code is transmitted. The operation of the MB810 encoder is the same as when IDLE code is output. The codes in the third table of FIG. 8 are those codes that are used when align control information code is output. When the state of the MB810 encoder is s3, 1100001011 (that is, +K28.3) as shown in FIG. 8 is output and the encoder is transited to s4 state. Also, when align control information code is continuously transmitted, 1100001011 (that is, +K28.3) is transmitted and the encoder is transited to s5 state. When align control information code is continuously transmitted further, 0011110100 (that is, −K28.3) is output and the encoder is transited to s4 state.

Codes written in the first table of FIG. 9 are fault control information codes, codes written in the second table are frame start information codes, codes written in the third table are frame end information codes, and codes written in the fourth table are error control information codes. When the codes shown in FIG. 9 are output, the MB810 encoder operates in the same manner as when IDLE code is output.

Next, state transition information related to operations of the MB810 encoder when encoding 8-bit data information is written in tables shown in FIGS. 5 through 7.

In the first table shown in FIG. 5, a method used to encode data items of data group 0~57 shown in FIGS. 2*a* and 2*b* is shown. For example, when the MB810 encoder is in s4 state, a code in group A_L row in the first table shown in FIG. 5 is output and the encoder is transited to s1 state. If a data item of data group 0~57 is continuously encoded, a code in group A_R row in the first table shown in FIG. 5 is output and the encoder is transited to s4 state.

In the second table shown in FIG. 5, a method used to encode data items of data group 58~136 shown in FIGS. 2*b* and 2*c* is shown. For example, when the MB810 encoder is in s3 state, a code in group A_L row of the second table shown in FIG. 5 is output and the encoder is transited to s4 state. If a data item of data group 58~136 is continuously encoded, a code in group A_L row of the second table of FIG. 5 is output and the encoder is transited to s5 state. If a data item of data group 58~136 is continuously encoded further, a code in group A_R row of the second table of FIG. 5 is output and the encoder is transited to s4 state.

In the third table shown in FIG. 5, a method used to encode data items of data group 137~160 shown in FIGS. 2*c* and 2*d* is shown. For example, when the MB810 encoder is in s3 state, a code in group A_L row of the third table shown in FIG. 5 is output and the encoder is transited to s0 state. If a data item of data group 137~160 is continuously encoded, a code in group A_R row of the third table shown in FIG. 5 is output and the encoder is transited to s9 state. If a data item of data group 137~160 is continuously encoded further, a code in group A_L row of the third table shown in FIG. 5 is output and the encoder is transited to s6 state. If a data item of data group 137~160 is continuously encoded still further, a code in group A_L row of the third table shown in FIG. 5 is output and the encoder is transited to s3 state.

In the first table shown in FIG. 6, a method used to encode data items of data group 161~185 shown in FIG. 2*d* is shown. For example, when the MB810 encoder is in s10 state, a code in group A_L row of the first table shown in FIG. 6 is output and the encoder is transited to s1 state. If a data item of data group 161~185 is continuously encoded, a code in group A_R row of the first table shown in FIG. 6 is output and the encoder is transited to s4 state. If a data item of data group 161~185 is continuously encoded further, a code in group A_R row of the first table of FIG. 6 is output and the encoder is transited to s7 state. If a data item of data group 161~185 is continuously encoded still further, a code in group A_R row of the first table shown in FIG. 6 is output and the encoder is transited to s10 state.

In the second and third tables shown in FIG. 6, a method used to encode data items of data group 186~215 shown in FIGS. 2*d* and 2*e* is shown. For example, when the MB810 encoder is in s10 state, a code in group A_L row in the second table shown in FIG. 6 is output and the encoder is transited to s5 state. If a data item of data group 186~216 is continuously encoded, a code in group B_R row of the third table shown in FIG. 6 is output and the encoder is transited to s0 state. If a data item of data group 186~216 is continuously encoded further, a code in group B_L row of the third table shown in FIG. 6 is output and the encoder is transited to s5 state. If a data item of data group 186~216 is continuously encoded still further, a code in group B_R row of the third table shown in FIG. 6 is output and the encoder is transited to s0 state.

In the first and second tables shown in FIG. 7, a method used to encode data items of data group 216~244 shown in FIG. 2*e* is shown. For example, when the MB810 encoder is in s1 state, a code in group A_L row in the first table shown in FIG. 7 is output and the encoder is transited to s8 state. If a data items of data group 216~244 is continuously encoded, a code in group B_R row of the second table shown in FIG. 7 is output and the encoder is transited to s9 state. If a data items of data group 216~244 is continuously encoded further, a code in group B_L row of the first table shown in FIG. 7 is output and the encoder is transited to s8 state.

In the first and second tables shown in FIG. 7, a method used to encode data items of data group 216~244 shown in FIG. 2e is shown. For example, when the MB810 encoder is in s1 state, a code in group A_L row in the first table shown in FIG. 7 is output and the encoder is transited to s8 state. If a data item of data group 216~244 is continuously encoded, a code in group B_R row of the second table shown in FIG. 7 is output and the encoder is transited to s9 state. If a data item of data group 216~244 is continuously encoded further, a code in group B_L row of the first table shown in FIG. 7 is output and the encoder is transited to s8 state.

In the third and fourth tables shown in FIG. 7, a method used to encode data items of data group 245~255 of the data group shown in FIGS. 2e and 2f is shown. For example, when the MB810 encoder is in s0 state, a code in group B_L row in the fourth table shown in FIG. 7 is output and the encoder is transited to s7 state. If a data item of data group 245~255 is continuously encoded, a code in group A_L row of the third table shown in FIG. 7 is output and the encoder is transited to s2 state. If a data item of data group 245~255 is continuously encoded further, a code in group A_R row of the third table shown in FIG. 7 is output and the encoder is transited to s7 state.

Figures 10, 11:
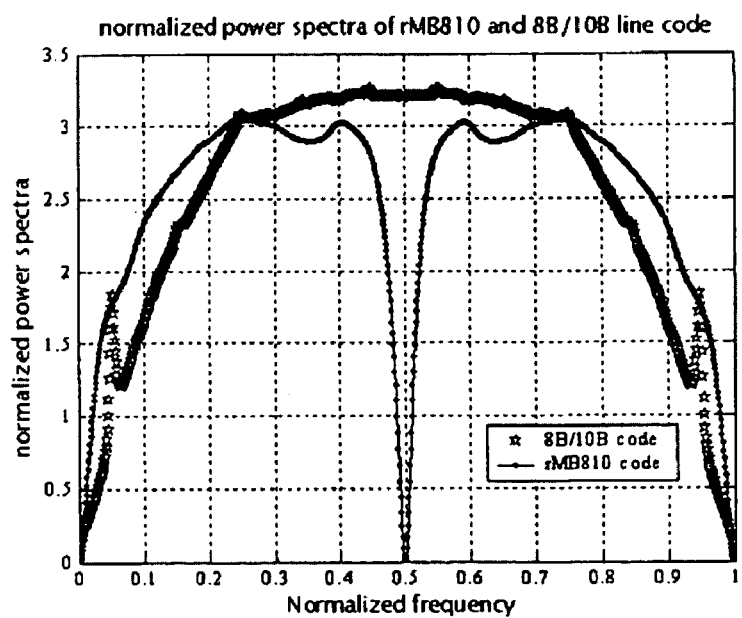

FIG. 10 shows a state transition method for surplus codes that can be used internally for special purposes such as transition state information transmission, PCS synchronization or error indication. The operation method of codes belonging to the first and second tables shown in FIG. 10 is the same as the operation method to encode data items of data group 245~255 explained above referring to FIG. 7.

Meanwhile, the operation method of codes belonging to the third and fourth tables shown in FIG. 10 is basically the same as the operation method of the codes belonging to the first table shown in FIG. 5, but in selecting a code, a code beginning with a sign opposite that of the last bit of a code output immediately before is selected. For example, if the last bit output immediately before is 1 and the current state after finishing transmission of a corresponding code is s3, a code in group B_L row in the fourth table shown in FIG. 10 is output and the encoder is transited to s0 state. If the last bit output immediately before is 0 and the current state after finishing transmission of a corresponding code is s3, a code in group A_L row in the fourth table shown in FIG. 10 is output and the encoder is transited to s0 state.

By using the characteristics of the codes selected as described above, a code error can be easily detected similarly to the 8B/10B code. That is, all control codes except IDLE code and align control code (that is, K28.3) have five 1's among 10 bits, and disparity (the degree that the number of 1's is not the same as the number of 0's in a code) is 0, and if identical codes are continuously transmitted, codes are always output in an alternate method (that is, outputting a complementary code). In addition, though disparity of K28.3 is 2, if identical codes are continuously transmitted, codes are always output in an alternate method in all the remaining state except s0, s3, s8, and s11 states. Also, when codes of an identical group are continuously transmitted, data group 0~57 operate the same as IDLE code and disparity is 0. Data group 59~136 operate in the same manner as K28.3 and disparity is the same as that of K28.3. Data group 137~184 do not operate in an alternate method but disparity is 0. Data group 185~255 are combinations of codes whose disparities are 2 and 4, but when codes of an identical group (data group 185~255 and the first and second code groups shown in FIG. 10 are regarded as identical groups) are continuously output, states are transited always in the direction that disparity is reduced. Finally, though disparity of data group 245~255 and the first and second code groups shown in FIG. 10 is 2, when identical codes are continuously transmitted, codes are always output in an alternate method in all the remaining states except s0, s3, s8, and s11 states. That is, except codes whose disparity is 0, those codes that continuously cause identical disparities are not transmitted twice or more. Accordingly, by using these characteristic, if an increasing or decreasing direction of disparity occurs twice or more, it is possible to determine an error.

When the power spectra of MB810 line code generated by the method described above and the power spectra of the prior art 8B/10B line code are calculated according to a method disclosed in an article "Spectra of Block Coded Digital Signals" (IEEE Trans. on Comm., Vol., COM-22, No. 10, pp 1555-1564, October, 1974), the power spectra of 8B/10B line code are DC-free, while the power spectra of MB810 line code are not only DC-free but also spectral null in the Nyquist frequency (that is, a normalized frequency=0.5) as shown in FIG. 11.

Figure 12:
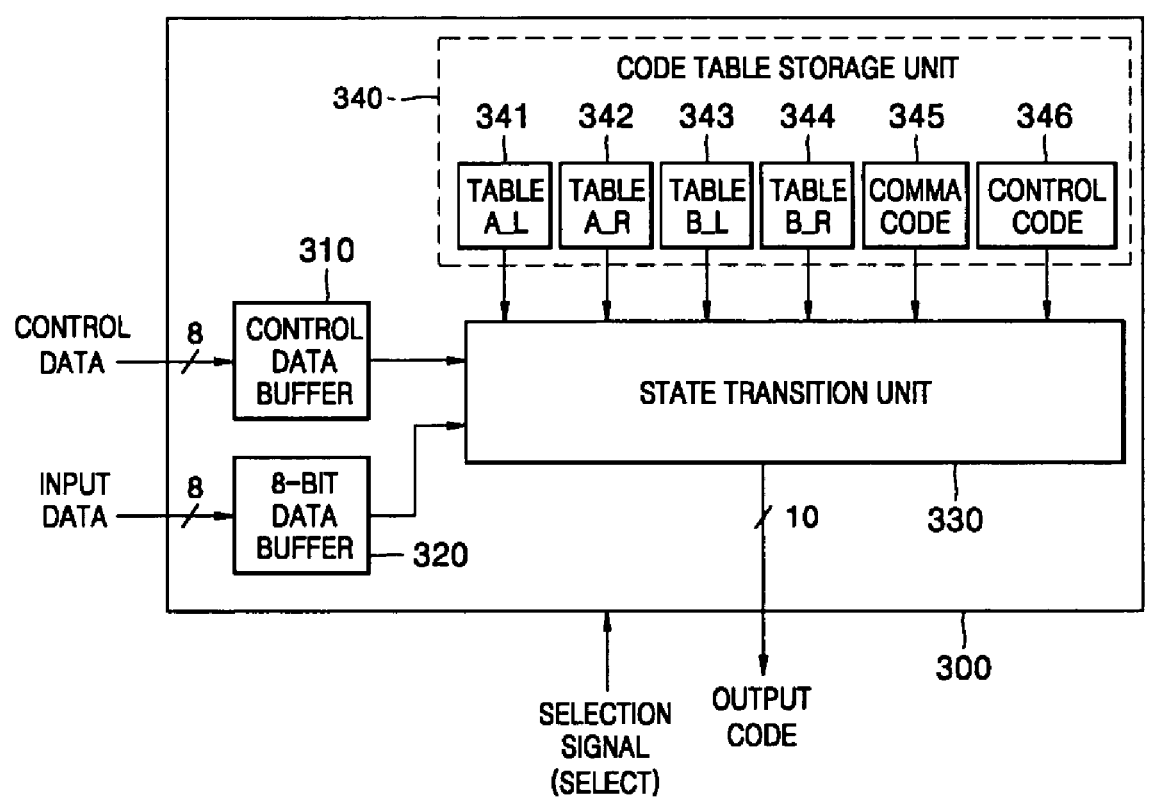
FIG. 12 is a block diagram of the structure of an MB810 encoder according to the present invention constructed by using codes generated by an MB810 code generation method according to the present invention.

FIG. 12 is a block diagram of the structure of an MB810 encoder according to the present invention constructed by using codes selected by the method described above.

Referring to FIG. 12, the MB810 encoder according to the present invention comprises a control data buffer 310, an 8-bit data buffer 320, a state transition unit 330, and a code table storage unit 340. The code table storage unit 340 comprises table A_L block 341, table A_R block 342, table B_L block 343, table B_R block 344, a comma code block 345, and a control code block 346 and these blocks can be combined and implemented as one block. Table A_L block 341, table A_R block 342, table B_L block 343, table B_R block 344 are for data codes and the comma code block 345 and control code block 346 are for control codes. A selection signal is a signal provided from the outside and indicates whether or not the MB810 encoder 300 is used.

Even though the internal state of the state transition unit 330 is an arbitrary state in an initial state of the MB810 encoder, it does not affect the operation of the MB810 encoder. However, for convenience, the internal state of the state transition unit 330 may be set to 0 when the encoder is initialized.

Input data is 8-bit data and is input from the outside in parallel. Control data is an 8-bit signal for controlling the operational state of the MB810 encoder and is input from the outside in parallel. Examples of control data are shown in FIG. 3 and FIGS. 8 through 10 and control data includes IDLE signal, align control information, and so on.

Control data input from the outside is stored in the control data buffer 310 and the control data buffer 310 outputs the stored control data to the state transition unit 330. Meanwhile, the input data input from the outside is stored in the 8-bit data buffer 320 and the 8-bit data buffer 320 outputs the stored input data to the state transition unit 330.

At this time, a case where the input data and control data are input at the same does not take place. That is, when the input data is input, the control data is not input, and when the control data is input, the input data is not input.

Accordingly, if the input data is input from the 8-bit data buffer 320, the state transition unit 330 reads out a code recorded in table A_L block 341, table A_R block 342, table B_L block 343, and table B_R block 344 according to the its own state information and the content of the input data, and outputs a 10-bit parallel code as an output code. Then, the state is transited as described above referring to FIGS. 5 through 7.

Also, if the control data is input from the control data buffer 310, the state transition unit 330 reads out a code recorded in the comma code block 345 and control code block 346 as shown in FIGS. 8 through 10 according to its own state information and the content of the control data, and outputs a 10-bit parallel code as an output code. Then, the state is transited as described above referring to FIGS. 8 through 10.

Figure 13:
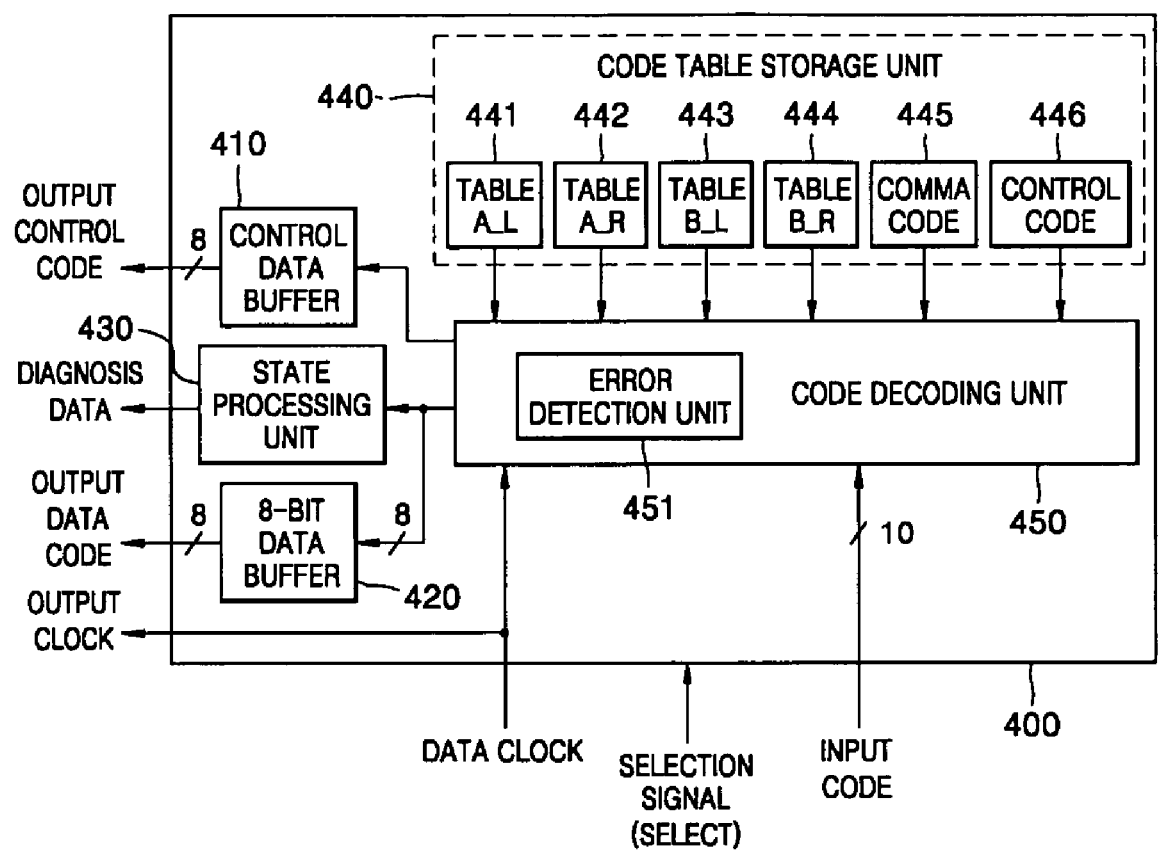
FIG. 13 is a block diagram of the structure of an MB810 decoder according to the present invention constructed by using codes generated by an MB810 code generation method according to the present invention.

FIG. 13 is a block diagram of the structure of MB810 decoder according to the present invention.

Referring to FIG. 13, the MB810 decoder 400 according to the present invention comprises a control data buffer 410, an 8-bit data buffer 420, a state processing unit 430, a code table storage unit 440, and a code decoding unit 450. The code table storage unit 440 comprises table A_L block 441, table A_R block 442, table B_L block 443, table B_R block 444, a comma code block 445, and a control code block 446, and these blocks may be combined and implemented as one block. Table A_L block 441, table A_R block 442, table B_L block 443, table B_R block 444 are for data codes and the comma code block 445 and control code block 446 are for control codes. A selection signal is a signal provided from the outside and indicates whether or not the MB810 decoder 400 is used. Data clock is a clock signal provided from the outside to operate the MB810 decoder 400.

If a 10-bit input code input from the outside in parallel is a data code, the code decoding unit 450 converts the input data code into 8-bit data information, referring to code tables stored in table A_L block 441, table A_R block 442, table B_L block 443, table B_R block 444, and transfers the converted 8-bit data to the 8-bit data buffer 420. FIGS. 3a through 3e show code tables stored in table A_L block 441, table A_R block 442, table B_L block 443, table B_R block 444. The 8-bit data buffer 420 outputs in parallel the 8-bit data input from the code decoding unit 450.

Also, if the 10-bit input code input in parallel from the outside is a control code, the code decoding unit 450 converts the input control code into an 8-bit control code, referring to code tables stored in the comma code block 445 and control code block 446, and transfers the converted 8-bit control code to the control data buffer 410. Code tables stored in the comma code block 445 and control code block 446 are shown in FIGS. 8 through 10. The control data buffer 410 outputs in parallel the 8-bit control code input from the code decoding unit 450.

Meanwhile, the code decoding unit 450 transfers two types of information to the state processing unit 430. First, error determination information by the error detection unit 451 placed inside the code decoding unit 450 is transferred to the state processing unit 430. Also, when a 10-bit code is input in parallel from the outside, if the input code is a code internally defined in the MB810 encoder/decoder, the code decoding unit 450 converts the input 10-bit code into 8-bit data information, referring to the ode table recorded in the control code block 446, and transfers the converted 8-bit data information to the state processing unit 430. The code table stored in the control code block 446 is shown in FIG. 3.

The error detection unit 451 is an element placed inside the code decoding unit 450 checks whether or not the input 10-bit code is a code existing in the code table storage unit 440, checks disparity of the input 10-bit code according to the method described above, counts the frequency of the increasing or decreasing directions of disparity, and if the increases or decreases are twice or more, determines that an error occurred in the input 10-bit code. That is, a code whose disparity is 0 does not cause a change to the previous disparity state, but if the previous disparity state is +1 (that is, a code in which the number of 1's is less than the number of 0's is once received) and the disparity of the currently input code is also +, the internal counter of the error detection unit 451 becomes +2. Meanwhile, if the previous disparity state is +1 and the disparity of the currently input code is −, the internal counter of the error detection unit 451 becomes 0. When the internal counter of the error detection unit 451 is +2, if the disparity of the currently input code is also +, the internal counter of the error detection unit becomes +3 such that the error detection unit 451 determines that an error occurred in the received code.

Based on the error determination result input from the code decoding unit 450, the state processing unit 430 outputs 8-bit diagnosis data in parallel. In addition, based on the 8-bit data code input from the code decoding unit 450, the state processing unit 430 outputs 8-bit diagnosis data in parallel. Since the codes internally defined by this MB810 encoder/decoder are not essential in the operation of the MB810 encoder/decoder, those codes can be used selectively.

Figure 14:
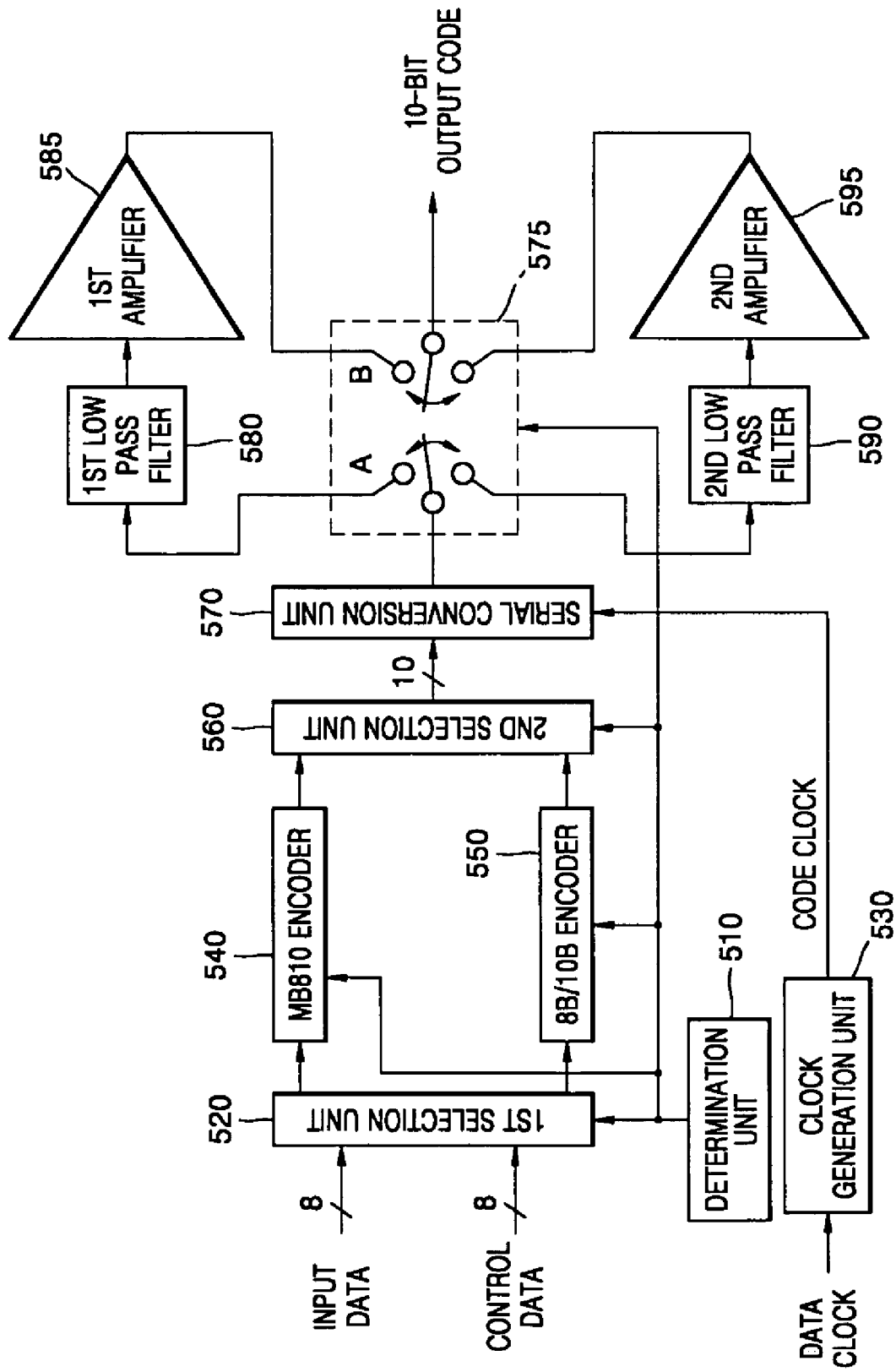
FIG. 14 is a block diagram showing the structure of a dual mode encoder according to the present invention.

FIG. 14 is a block diagram showing the structure of a dual mode encoder according to the present invention.

Referring to FIG. 14, the dual mode encoder according to the present invention comprises a determination unit 510, a first selection unit 520, a clock generation unit 530, an MB810 encoder 540, an 8B/10B encoder 550, a second selection unit 560, a serial conversion unit 570, a switch unit 575, a first low pass filter 580, a first amplifier 585, a second low pass filter 590, and a second amplifier 595. The clock generation unit 530, the 8B/10B encoder 540, the serial conversion unit 570, the first low pass filter 580, and the first amplifier 585 are elements forming the prior art 8B/10B encoder.

The determination unit 510 determines whether the dual mode encoder according to the present invention is to be used in MB810 encoder mode or 8B/10B encoder mode. The determination unit provides mode selection information to the first selection unit 520, the MB810 encoder 540, the 8B/10B encoder 550, the second selection unit 560, and the switch unit 575. By input a mode selection command, a user can control the determination content of the determination unit 510.

If a data clock is provided, the clock generation unit 510 generates a code clock for a 10-bit code, and provides to the serial conversion unit 570.

Based on mode selection information provided by the determination unit 520, the first selection unit 520 transfers 8-bit input data and control data input in parallel from the outside, to one of the MB810 encoder 540 and the 8B/10B encoder 550.

The MB810 encoder 540 has the same structure as that of the MB810 encoder 300 explained referring to FIG. 12. If mode selection information indicating that the MB810 encoder is determined as the operating encoder is input from the determination unit 510, the MB810 encoder 540 performs encoding based on the encoding method of the MB810 encoder 300 explained referring to FIG. 12, and provides the generated 10-bit code to the second selection unit 560.

If mode selection information indicating that the 8B/10B encoder is determined as the operating encoder is input from the determination unit 510, the 8B/10B encoder 550 performs encoding based on the 8B/10B encoding method, and provides the generated 10-bit code to the second selection unit 560.

The second selection unit 560 provides the 10-bit parallel code provided by the encoder determined as the operating encoder by the determination unit 510 (that is, any one of the MB810 encoder 540 and the 8B/10B encoder 550), to the serial conversion unit 570. The serial conversion unit 570 converts the input 10-bit parallel code into a 10-bit serial code and provides to the switch unit 575.

The switch unit 575 drives switch A so that the output signal of the serial conversion unit 570 is transferred to a low pass filter 580 or 590 corresponding to the encoder selected as the operating encoder by the determination unit 510 and drives switch B so as to selectively output the output signal of an amplifier 585 or 595.

The first low pass filter 580 and the first amplifier 585 are elements corresponding to the MB810 encoder 540 and the second low pass filter 590 and the second amplifier 595 are elements corresponding to the 8B/10B encoder 550.

Figure 15:
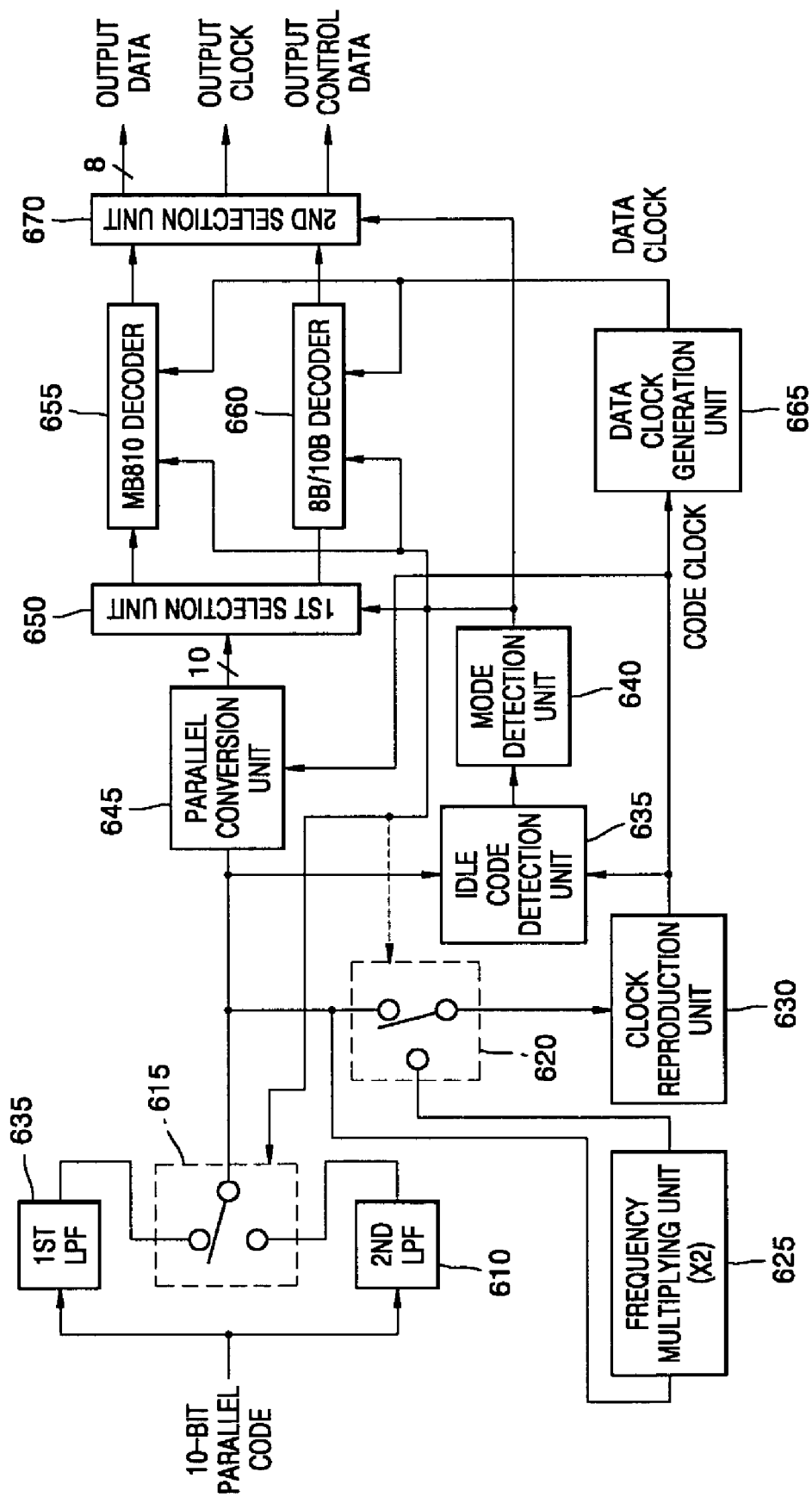
FIG. 15 is a block diagram showing the structure of a dual mode decoder according to the present invention.

The first low pass filter 580 in combination with a first low pass filter 605 shown in FIG. 15 has a cut-off frequency which becomes an optimum filter, and the roll off characteristic at the cut-off frequency is the same as that of the second low pass filter 590. At this time, the roll off characteristic at the cut-off frequency means the attenuation amount for each frequency level compared to a reference frequency and group delay distortion.

The cut-off frequency that becomes an optimum filter by combination of the first low pass filter 580 and the first low pass filter 605 shown in FIG. 15 is half the cut-off frequency by combination of the second low pass filter 590 and a second low pass filter 610 corresponding to the 8B/10B decoder 660 shown in FIG. 15.

The first low pass filter 580 cuts off the high frequency band of the 10-bit serial code input through switch A of the switch unit 575 according to a designed cut-off frequency and roll off characteristic, and transfers the code to the first amplifier 585. The first amplifier 585 amplifies the signal input from the first low pass filter 580 to suit an output power level determined by IEEE 802.3 standard specifications, and outputs the signal as a 10-bit output code through switch B of the switch unit 575.

The second low pass filter 590 cuts off the high frequency band of the 10-bit serial code input through switch A of the switch unit 575 according to a cut-off frequency designed complying with IEEE 802.3 standard specifications and roll off characteristic, and transfers the code to the second amplifier 595. The second amplifier 595 amplifies the signal input from the second low pass filter 590 to suit an output power level determined by IEEE 802.3 standard specifications, and outputs the signal as a 10-bit output code through switch B of the switch unit 575.

FIG. 15 is a block diagram showing the structure of a dual mode decoder according to the present invention.

Referring to FIG. 15, the dual mode decoder comprises a first low pass filter 605, a second low pass filter 610, a first switch unit 615, a second switch unit 620, a frequency multiplying unit 625, a clock reproduction unit 630, an IDLE code detection unit 635, a mode detection unit 640, a parallel conversion unit 645, a first selection unit 650, an MB810 decoder 655, an 8B/10B decoder 660, a data clock generation unit 665, and a second selection unit 670. Among these elements, the second switch unit 620 and the frequency multiplying unit 625 are selected employed, and when there is a user request, mode selection information detected in the mode detection unit 640 is transferred to the second switch unit 620.

The first low pass filter 605 is a filter corresponding to the MB810 decoder 655. The first low pass filter 605 cuts off the high frequency band of an input 10-bit serial code according to a designed cut-off frequency and roll off characteristic, and transfers the code to the first switch unit 615. The second low pass filter 610 is a filter corresponding to the 8B/10B decoder 660. The second low pass filter 610 cuts off the high frequency band of the input 10-bit serial code according to a designed cut-off frequency and roll off characteristic, and transfers the code to the first switch unit 615. The first low pass filter 605 has a cut-off frequency which becomes an optimum filter by combination with the first low pass filter 580 shown in FIG. 14, and the roll off characteristic at the cut-off frequency is the same as that of the second low pass filter 610. The cut-off frequency which becomes an optimum filter by combination of the first low pass filter 605 and the first low pass filter 580 shown in FIG. 14 is half the cut-off frequency by combination of the second low pass filter 610 and the second low pass filter 590 corresponding to the 8B/10B encoder 550 shown in FIG. 14.

In its initial state, the first switch unit 615 selects the output of the second low pass filter 610, and when there is a request of the mode detection unit 640, selects the first low pass filter 605. The first switch unit 615 transfers the output of the selected low pass filter 605 or 610, to the second switch unit 620, the frequency multiplying unit 625, the IDLE code detection unit 635, and the parallel conversion unit 645.

The frequency multiplying unit 625 multiplies the frequency of the 10-bit serial code provided through the first switch unit 615 by 2, and outputs the result to the second switch unit 620. When there is no request from the mode detection unit 640, the second switch unit 620 selects the output of the first switch unit 615, and when there is a request from the mode detection unit 640, selects the output of the frequency multiplying unit 625. The second switch unit 620 transfers the selected output to the clock reproduction unit 630.

The clock reproduction unit 630 extracts a 10-bit clock signal from the 10-bit serial code input through the second switch unit 620, and provides the signal to the IDLE code detection unit 635, the parallel conversion unit 645, and the data clock generation unit 665. The data clock generation unit 665 converts the 10-bit code clock input from the clock reproduction unit 630, into an 8-bit data clock and provides the clock signal to the MB810 decoder 655 and the 8B/10B decoder 660.

The IDLE 635 detects +K28.5/−K28.5 and +K28.7/−K28.7 codes that are IDLE codes to recognize as the boundary of a 10-bit code, and transfers input codes in units of 10-bit codes, to the mode detection unit 640. At this time, if K28.7 code is detected contiguously twice or more, the IDLE code detection unit 635 recognizes the corresponding code as IDLE code.

The mode detection unit 640 analyzes the contents of IDLE code input from the IDLE code detection unit 635 and determines whether the dual mode decoder according to the present invention is to be used as the MB810 decoder 655 or the 8B/10B decoder 660. The mode detection unit 640 transfers mode determination information to the first switch unit 650, the second selection unit 670, the MB810 decoder 655, and the 8B/10B decoder 660. Also, when there is a user request, the mode detection unit 640 operates the second switch unit 620 so that the output of the frequency multiplying unit 625 is transferred to the clock reproduction unit 630.

The parallel conversion unit 645 converts the 10-bit serial code input from the first switch unit 615 into a 10-bit parallel code and transfers the parallel code to the first selection unit

650. The first selection unit 650 transfers the 10-bit parallel code input from the parallel conversion unit 645 to one of the MB810 decoder 655 and the 8B/10B decoder 660 according to the mode determination information input from the mode detection unit 640.

The MB810 decoder 655 converts the 10-bit code information input from the first selection unit 650 into 8-bit data information according to the MB810 decoding method explained referring to FIG. 13. The 8-bit data information output from the MB810 decoder 655 is output as 8-bit parallel data, clock information and control code, through the second selection unit 670.

The 8B/10B decoder 660 converts the 10-bit code information into 8-bit data information according to the 8B/10B decoding method. The 8-bit data information output from the 8B/10B decoder 660 is output as 8-bit parallel data, clock information and control code, through the second selection unit 670.

Figure 16A:
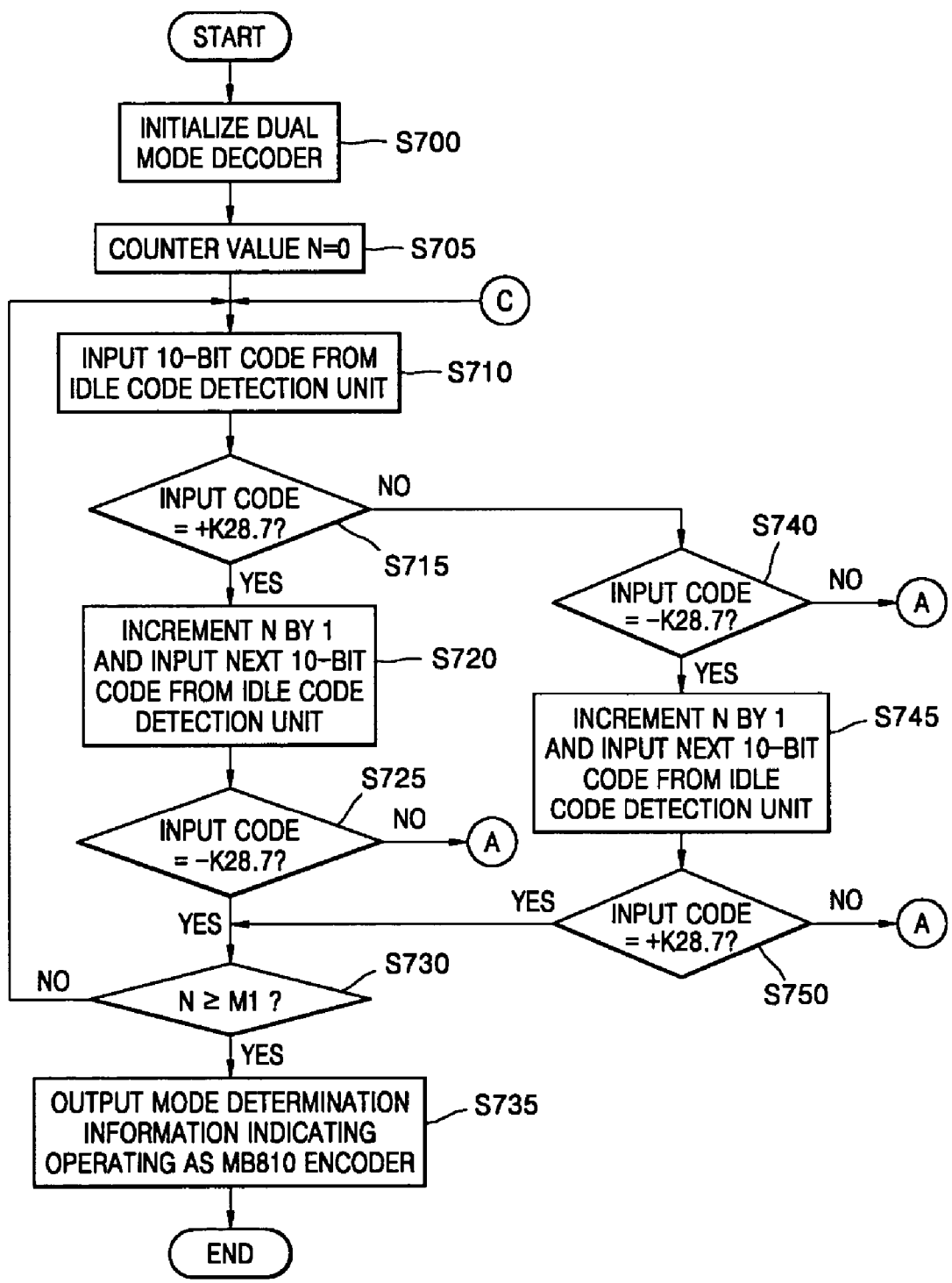
FIGS. 16a and 16b are flowcharts of the steps performed by a dual mode processing method according to the present invention.
Figure 16B:
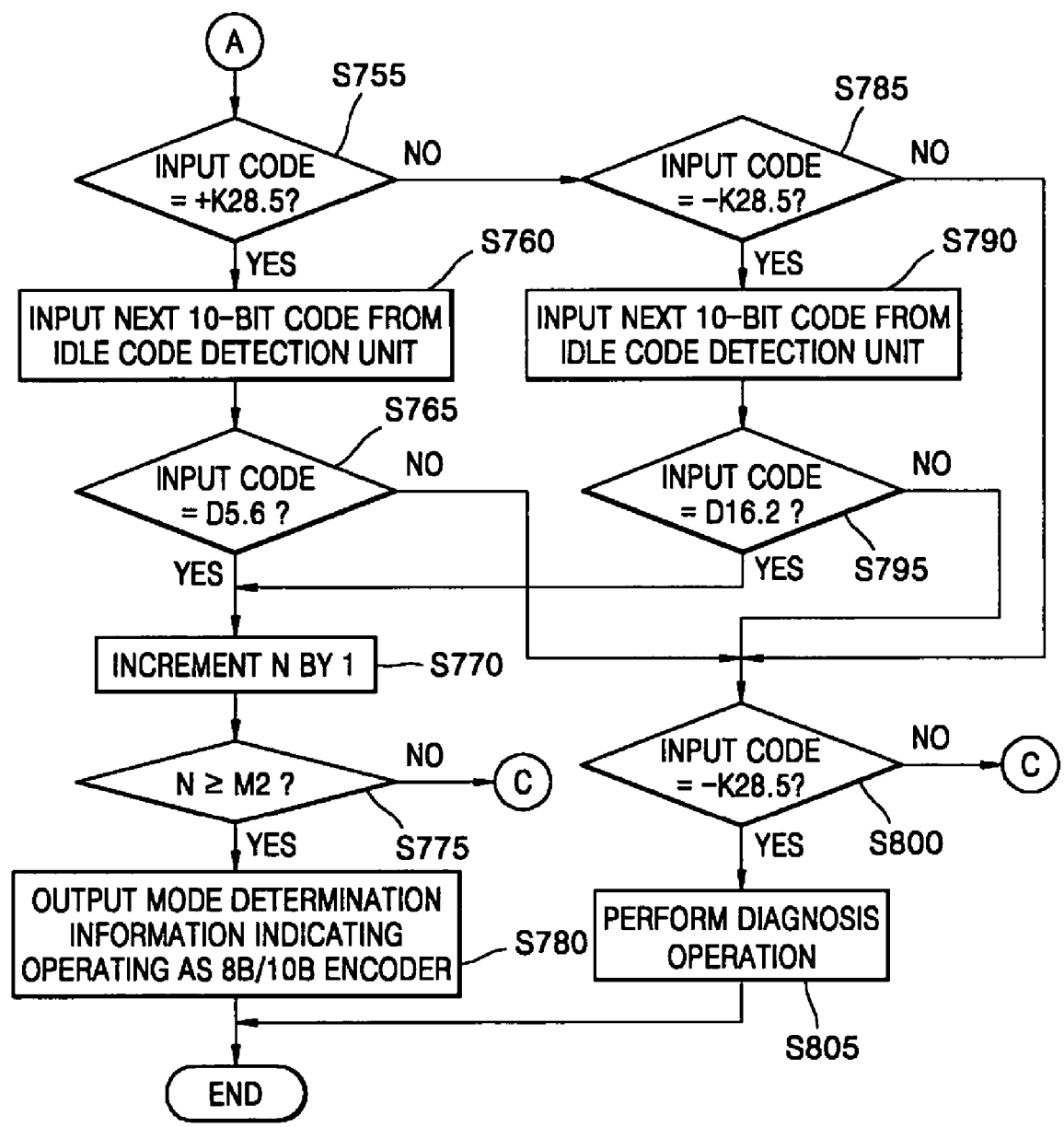

FIGS. 16*a* and 16*b* are flowcharts of the steps performed by a dual mode processing method according to the present invention. The flowcharts of FIGS. 16*a* and 16*b* are showing a process for the mode detection unit 640 determining a mode of the decoder when the dual mode decoder shown in FIG. 15 is initialized.

Referring to FIGS. 16*a* and 16*b*, if the dual mode decoder is initialized in step S700, the mode detection unit 640 sets count value N of the counter arranged inside the mode detection unit 640, to 0 in step S705. The initialization operation of the dual mode decoder may be set so that the initialization operation is performed when an enough IDLE time continues according to the set state. The counter is an element counting the number of IDLE codes in order to determine the operation mode of the dual mode decoder. After the initialization is performed, the mode detection unit 640 receives a code from the IDLE code detection unit 635 in step S710. Then, the mode detection unit 640 checks whether or not the received code is +K28.7 that is the IDLE code of the MB810 decoder in step 715. If the input code is +K28.7, the mode detection unit 640 increases count value N of the counter by 1 and again receives a next code from the IDLE code detection unit 635 in step S720.

Next, the mode detection unit 640 checks whether or not the code input in the step S720 is −K28.7 in step S725. If the code input in the step S720 is −K28.7, the mode detection unit 640 compares the number of K28.7 codes input till that time, with a set reference value M1 in step S730. Reference value M1 is a value preset by the user and a value defined in IEEE 802.3 specifications may be set as reference value M1. If it is determined that the number of K28.7 codes input till that time is equal to or greater than reference value M1, the mode detection unit 640 outputs mode determination information indicating that the dual mode decoder according to the present invention operates as the MB810 decoder in step S735. Unlike this, if it is determined that the number of K28.7 codes input till that time is less than reference value M1, the step S710 is performed. If it is determined that the code input in the step S720 is not −K28.7, the mode detection unit 640 performs step S755.

Meanwhile, if it is determined that the code input in the step S710 is not +K28.7, the mode detection unit 640 checks whether or not the code input in the step S710 is −K28.7 in step S740. If the code input in the step S710 is −K28.7, the mode detection unit 640 increases count value N of the counter by 1, and again receives a next code from the IDLE code detection unit 635 in step S745. Then, the mode detection unit 640 checks whether or not the code input in the step S745 is +K28.7 in step S750. If the code input in the step S745 is +K28.7, the mode detection unit 640 performs the step S730. Unlike this, if the code input in the step S745 is not +K28.7, the mode detection unit 640 checks whether or not the code input in the step S745 is +K28.5 that is the IDLE code of the 8B/10B decoder in the step S755. If the code input in the step S710 is not −K28.7, the mode detection unit 640 performs the step S755. The step S755 is performed when the code received by the mode detection unit in the step S710 is neither +K28.7 nor −K28.7, when the code input in the step S720 is not −K28.7, and when the code input in the step S745 is not +K28.7.

If the result of performing the step S755 indicates that the input code is +K28.5, the mode detection unit 640 again receives a next code from the IDLE code detection unit 635 in step S760. Then, the mode detection unit 640 checks whether or not the code input in the step S760 is D5.6 code of 8B/10B (that is, 1010010110) in step S765. If the code input in the step S760 is D5.6 code, the mode detection unit 640 increases count value N of the counter by 1 in step S770. After increasing count value N of the counter by 1, the mode detection unit 640 checks whether or not the number of K28.5 codes received till that time is equal to or greater than reference number M2 in step S775. Reference number M2 is a value preset by the user and a value defined in IEEE 802.3 specifications may be set as reference number M2. If the number of K28.5 codes continuously received till that time is equal to or greater than reference number M2, the mode detection unit 640 outputs mode determination information indicating that the dual mode decoder according to the present invention operates as the 8B/10B decoder in step S780. Unlike this, if the number of K28.7 codes input till that time is less than set reference number M2, the mode detection unit 640 performs the step S710.

Meanwhile, if the code input in the step S760 is not D5.6 code, the mode detection unit checks whether the code input in the step S760 is a control code in step S800. If the code input in the step S760 is a control code, the mode detection unit 640 performs the step S710. Unlike this, if the code input in the step S760 is not a control code, the mode detection unit 640 determines that an error such as a transmission line error has occurred, and performs the step S700 or performs a diagnostic operation such as transmission of a test code in step S805.

Meanwhile, if the result of performing the step S755 indicates that the codes input in the steps S710, S720, and S745 are not +K28.5, the mode detection unit 640 checks whether or not the codes input in the steps S710, S720, and S745 are −K28.5 in step are −K28.5 in step S785. If the codes input in the steps S710, S720, and S745 are −K28.5, the mode detection unit again receives a next code from the IDLE code detection unit 635 in step S790. Then, the mode detection unit 640 checks whether or not the code input in the step S790 is D16.2 in step S795. If the code input in the step S790 is D16.2, the mode detection unit 640 performs the step S770. Unlike this, if the code input in the step S790 is not D16.2, the mode detection unit 640 performs the step S800.

According to the MB810 line code apparatus and MB810 code generation method using the control codes according to the present invention, the transmission bandwidth becomes half that of the prior art including the 8B/10B codes such that when an identical transmission medium is used, relatively long-distance transmission is enabled. In addition, the present invention can be applied with the MB810 codes without changing the prior art 8B/10B code method such that the dual mode operation allowing the user to select a desired line code can be performed. Furthermore, the serial conversion apparatus, the parallel conversion apparatus, the clock reproducing unit and data clock generation unit of the decoder, and code clock generation unit of the encoder in the prior art 8B/10B code apparatus can be utilized without change.

Meanwhile, according to the present invention, the low pass filter used in the MB810 encoder and the low pass filter used in the MB810 decoder have characteristics identical to the roll off characteristics of the low pass filters of the 8B/10B encoder and decoder. In addition, the cut-off frequency by combination of the low pass filter of the MB810 encoder and the low pass filter used in the MB810 decoder is half the cut-off frequency by combination of the low pass filter of the 8B/10B encoder and the low pass filter of the 8B/10B decoder and is much easier to be implemented by an identical technology. In particular, the bandwidth required by the amplifier of the MB810 encoder is half the bandwidth required by the amplifier of the 8B/10B encoder and can be implemented easily by an identical technology.

Furthermore, when a code is set, a complementary code is always used such that the operation of the decoder is simplified. Also, transition from all states is available and K28.7 that has a single pair and is a reserved code in the 8B/10B code system is set as IDLE code. By doing so, when the apparatus operates in dual mode, the 8B/10B codes and MB810 codes can be easily distinguished and the structure in the physical layer is simplified.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

While the present invention has been particularly shown and described with reference to exemplary embodiments thereof, it will be understood by those of ordinary skill in the art that various changes in form and details may be made therein without departing from the spirit and scope of the present invention as defined by the following claims. Such variations and modifications are within the scope of the present invention defined in the appended claims.

What is claimed is:

1. An MB810 code generation method comprising:
    forming 12 state points in the form of a 4×3 matrix on a state transition map formed with binary unit digital sum variation & alternate sum variation (BUDA) to generate a 10-bit code from 8-bit data;
    outputting a 10-bit code from a predetermined state point forming the matrix;
    selecting codes forming a complementary pair from a set of codes capable of arriving at state points forming the matrix;
    selecting codes forming the 12 state points by supplementing state points lacked in the codes forming a complementary pair;
    selecting control codes including IDLE code from the codes forming the 12 state points; and
    removing codes generating the IDLE code by a bit string between neighboring codes among the codes forming the 12 state points.

2. The MB810 code generation method of claim 1, wherein the selecting codes forming a complementary pair comprises:
    selecting codes forming a complementary pair among a set of codes capable of arriving at the state points forming the matrix;
    removing codes whose run length that is the number of contiguous 0's or 1's exceeds 6 among the selected codes forming complementary pairs; and
    removing a code whose run length is longer between two neighboring codes if the run length by the two neighboring codes exceeds 6 among the selected codes forming complementary pairs.

3. The MB810 code generation method of claim 1, wherein the selecting codes forming the 12 state points by supplementing state points comprises:
    selecting 24 first single code pairs, by combining 24 codes having state points, including s3, s4, s5, s6, s7, s8, s9, s10, and s11, with 24 codes having state points, including s0, s1, and s2, among the codes forming complementary pairs;
    selecting 24 second single code pairs, by combining 24 codes having state points, including s0, s1, s2, s3, s4, s5, s6, s7, and s8, with 24 codes having state points, including s9, s10, and s11, among the codes forming complementary pairs;
    selecting first double code pairs, by combining codes pairs having state points, including s0, s3, s5, s6, s8, and s11, with code pairs having state points, including s1, s2, s4, s7, s9, and s10, among the codes forming complementary pairs;
    selecting second double code pairs, by combining codes pairs having state points, including s0, s1, s4, s7, s10, and s11, with code pairs having state points, including s2, s3, s5, s6, s8, and s9, among the codes forming complementary pairs;
    selecting third double code pairs, by combining codes pairs having state points, including s0, s3, s8, and s11, with code pairs having state points, including s2, s4, s5, s6, s7, s9, and s11, among the codes forming complementary pairs; and
    forming third single code pairs by selecting codes in which the run length of start bits is 4, among codes that have state transitions of 9 state points and are not forming the complementary pairs, and selecting fourth double pairs by combining a pair of codes capable of starting with different signs, among the codes that have state transitions of 9 state points and are not forming the complementary pairs,
    wherein the codes selected as the third single code pairs and the fourth double code pairs are selected so that the final bit sign of the previous code is opposite to the start bit sign of a current code.

4. The MB810 code generation method of claim 1, wherein the selecting control codes including IDLE code from the codes forming the 12 state points comprises:
    in order to easily distinguish from a code corresponding to 8B/10B encoding mode, selecting K28.7 code that complies with IEEE 802.3 specifications and internally has 'comma' among codes that are not used as 8B/10B codes, and removing the selected K28.7 code from a candidate list for data codes and control codes;
    selecting K28.0, K28.3, K28.4, K27.7 and K30.7 codes that are control codes corresponding to the 8B/10B encoding mode defined in IEEE 802.3ae, as control codes of MB810 encoding mode performing the same functions as those of control codes corresponding to the 8B/10B encoding mode; and adding a code pair capable of traveling to state points to which the selected control codes are not transited, to the selected control codes, or replacing the K29.7 code with codes capable of traveling all state points only with the single code pair.

5. The MB810 code generation method of claim 1, wherein the removing codes generating the IDLE code by a bit string between neighboring codes among the codes forming the 12 state points comprises:

collecting cases of code combinations wherein −K28.7 comes immediately after +K28.7 or +K28.7 comes immediately after −K28.7 when code combinations according to the state transitions of the complementary pairs are continuously generated three times, and removing code pairs causing the cases of code combinations from the candidate list.

6. An MB810 encoder comprising:

a table storage unit which stores code tables having data codes written therein, the data codes generated by forming 12 state points in the form of a 4×3 matrix on a state transition map formed with binary unit digital sum variation & alternate sum variation (BUDA) to generate a 10-bit code from 8-bit data, and outputting a 10-bit code from a predetermined state point forming the matrix, and then, supplementing second codes having state points lacked in first codes forming complementary pairs selected from a set of 10-bit codes capable of arriving at state points forming the matrix, and then, selecting control codes including IDLE code among the first and second codes, and removing codes generating the IDLE code by a bit string between neighboring codes among the second codes, and codes that are selected as the control codes;

a first buffer unit which stores an 8-bit control code input from the outside;

a second buffer unit which stores an 8-bit control code input from the outside; and a state transition unit which, based on a current state and the contents of the 8-bit data code input from the first buffer unit, reads out a 10-bit data code from a code table stored in the table storage unit and outputs the code, and, based on a current state and the contents of the 8-bit control code input from the second buffer unit, reads out a 10-bit control code from a code table stored in the table storage unit, and based on predetermined state transition information, is transited to one of 12 state points on the state transition map.

7. The MB810 encoder of claim 6, wherein the code tables include a first code table in which a single code pair used as the data code is written, a second code table in which a double code pair used as the data code is written, and a third code table in which a comma code and control codes are written.

8. The MB810 encoder of claim 7, wherein if the 8-bit data code is input from the first buffer unit, the state transition unit reads out a data code recorded in the first and second code tables based on a current state and the contents of the 8-bit data code, and is transited to one of 12 state points on the state transition map based on the state transition information, and if the 8-bit control code is input from the second buffer unit, reads out a data code recorded in the first and second code tables based on a current state and the contents of the 8-bit control code, and is transited to one of 12 state points on the state transition map based on the state transition information.

9. The MB810 encoder of claim 6, wherein the state transition information includes first state information used when the 8-bit data code is input to the state transition unit, and second state information used when the 8-bit control code is input to the state transition unit.

10. An MB810 decoder comprising:

a table storage unit which stores code tables having data codes written therein, the data codes generated by forming 12 state points in the form of a 4×3 matrix on a state transition map formed with binary unit digital sum variation & alternate sum variation (BUDA) to generate a 10-bit code from 8-bit data, and outputting a 10-bit code from a predetermined state point forming the matrix, and then, supplementing second codes having state points lacked in first codes forming complementary pairs selected from a set of 10-bit codes capable of arriving at state points forming the matrix, and then, selecting control codes including IDLE code among the first and second codes, and removing codes generating the IDLE code by a bit string between neighboring codes among the second codes, and codes that are selected as the control codes;

a decoding unit which based on the contents of a 10-bit code input from the outside, reads out an 8-bit data code or an 8-bit control code from a code table stored in the table storage unit;

a first buffer unit which stores the 8-bit data code input from the decoding unit and then outputs the code to the outside; and a second buffer unit which stores the 8-bit control code input from the decoding unit and then outputs the code to the outside.

11. The MB810 decoder of claim 10, further comprising:

a state processing unit which, based on the contents of the 8-bit data code input from the decoding unit, outputs 8-bit diagnostic data indicating whether or not there is an error in the 10-bit code input from the outside.

12. The MB810 decoder of claim 11, wherein the code tables include a first code table in which a single code pair used as the data code is written, a second code table in which a double code pair used as the data code is written, and a third code table in which a comma code and control codes are written.

13. The MB810 decoder of claim 12, wherein if the 10-bit code is the data code, the decoding unit reads out an 8-bit data code recorded in the first and second code tables and outputs the code to the first buffer unit, and if the 10-bit code is the comma code or control code, reads out an 8-bit control code recorded in the third code table and outputs the code to the second buffer unit, and if the 10-bit code is a control code and an internal code for MB810 decoding, reads out an 8-bit control code recorded in the third code table and outputs the code to the state processing unit.

14. The MB810 decoder of claim 10, further comprising a state processing unit which, based on an error determination signal input from the decoding unit, outputs 8-bit diagnostic data indicating whether or not there is an error in the 10-bit code input from the outside, wherein the decoding unit further comprises:

an error detection unit which outputs the error determination signal by determining whether or not an 8-bit code corresponding to the 10-bit code is in the code table, and/or whether or not there is an error in the 10-bit code based on whether or not the increasing direction or decreasing direction of the disparity of the 10-bit code occurs more than a predetermined reference frequency.

15. A dual mode encoder comprising:

an MB810 encoder;

an 8B/10B encoder;

a determination unit which determines an encoder to be used as an operation encoder between the MB810 encoder and the 8B/10B encoder;

a first selection unit which provides an 8-bit code input from the outside to the encoder determined as the operation encoder;

a second selection unit which receives a 10-bit code corresponding to the 8-bit code from the encoder determined as the operation encoder, and outputs the code;

a serial conversion unit which converts the 10-bit code input from the second selection unit into a 10-bit serial code;

a code clock generation unit which receives a data clock from the outside, generates a code clock, and provides the clock signal to the serial conversion unit;

a first low pass filter which when the MB810 encoder is determined as the operation encoder, removes a predetermined frequency bandwidth from a 10-bit serial code input from the serial conversion unit;

a first amplifier which amplifies a 10-bit serial code input from the first low pass filter and outputs the code;

a second low pass filter which when the 8B/10B encoder is determined as the operation encoder, removes a predetermined frequency bandwidth from a 10-bit serial code input from the serial conversion unit;

a second amplifier which amplifies a 10-bit serial code input from the second low pass filter and outputs the code; and a switch unit which according to the encoder determined as the operation encoder, provides a 10-bit serial code output from the serial conversion unit selectively to the first and second low pass filters, and selectively outputs a 10-bit serial code output from the first and second amplifiers to the outside.

16. The dual mode encoder of claim 15, wherein the MB810 encoder comprises:

a table storage unit which stores code tables having data codes written therein, the data codes generated by forming 12 state points in the form of a 4×3 matrix on a state transition map formed with binary unit digital sum variation & alternate sum variation (BUDA) to generate a 10-bit code from 8-bit data, and outputting a 10-bit code from a predetermined state point forming the matrix, and then, supplementing second codes having state points lacked in first codes forming complementary pairs selected from a set of 10-bit codes capable of arriving at state points forming the matrix, and then, selecting control codes including IDLE code among the first and second codes, and removing codes generating the IDLE code by a bit string between neighboring codes among the second codes, and codes that are selected as the control codes;

a first buffer unit which stores an 8-bit control code input from the outside;

a second buffer unit which stores an 8-bit control code input from the outside; and a state transition unit which, based on a current state and the contents of the 8-bit data code input from the first buffer unit, reads out a 10-bit data code from a code table stored in the table storage unit and outputs the code, and, based on a current state and the contents of the 8-bit control code input from the second buffer unit, reads out a 10-bit control code from a code table stored in the table storage unit, and based on predetermined state transition information, is transited to one of 12 state points on the state transition map.

17. The dual mode encoder of claim 15, wherein the 8B/10B encoder is an encoder complying with IEEE 802.3ae specifications.

18. The dual mode encoder of claim 15, wherein the determination unit provides a mode selection command input by a user, to the first selection unit, the second selection unit, the MB810 encoder, the 8B/10B encoder, and the switch unit.

19. The dual mode encoder of claim 15, wherein the cut-off frequency by combination of the first low pass filter and a low pass filter arranged in an MB810 decoder corresponding to the MB810 encoder is half the cut-off frequency by combination of the second low pass filter and a low pass filter of an 8B/10B decoder corresponding to the 8B/10B encoder, and the first amplifier amplifies the power level of the 10-bit code output from the MB810 encoder to a power level defined in IEEE 802.3 at the cut-off frequency of the first low pass filter, and the roll of characteristics of the first low pass filter and the second low pass filter are identical.

20. The dual mode encoder of claim 15, wherein the cut-off frequency and roll off characteristic of the second low pass filter are the same as a cut-off frequency and roll off characteristic defined in IEEE 802.3, and the second amplifier amplifies the power level of the 10-bit code output from the 8B/10B encoder to a power level defined in IEEE 802.3, and the roll off characteristics of the first low pass filter and the second low pass filter are identical.

21. A dual mode decoder comprising:

an MB810 decoder;

an 8B/10B decoder;

a mode detection unit which detects a decoder to be used as an operation decoder between the MB810 decoder and the 8B/10B decoder;

a first low pass filter which when the MB810 decoder is determined as the operation decoder, removes a predetermined frequency bandwidth from a 10-bit code input from the outside;

a second low pass filter which when the 8B/10B decoder is determined as the operation decoder, removes a predetermined frequency bandwidth from a 10-bit code input from the outside;

an IDLE code detection unit which detects IDLE code from the 10-bit code and transfers to the mode detection unit;

a first switch unit which according to the decoder determined as the operation decoder, selectively outputs the 10-bit code input from the first low pass filter and the second low pass filter;

a parallel conversion unit which converts the 10-bit code input from the first switch into a parallel code and outputs a 10-bit parallel code;

a first selection unit which provides the 10-bit parallel code to the decoder determined as the operation decoder between the MB810 decoder and the 8B/10B decoder; and a second selection unit which selectively outputs an 8-bit code corresponding to the 10-bit parallel code input from the decoder determined as the operation decoder.

22. The dual mode decoder of claim 21, further comprising:

a frequency multiplying unit which the frequency of the 10-bit code input from the first switch unit by 2 and outputs the resulting frequency;

a second switch unit which based on a selection signal input from the mode detection unit, selectively outputs the 10-bit code and the output signal of the frequency multiplying unit;

a clock reproduction unit which extracts a 10-bit clock signal from a signal input from the second switch unit, and provides the extracted signal to the IDLE code detection unit and the parallel conversion unit; and a data clock generation unit which converts the 10-bit clock signal input from the clock reproduction unit into an 8-bit data clock and provides the 8-bit signal to the MB810 decoder and the 8B/10B decoder.

23. The dual mode decoder of claim 22, wherein in an initial state, the second switch unit selects the 10-bit code input from the first switch, as an output signal.

24. The dual mode decoder of claim 22, wherein when the MB810 decoder is determined as the operation decoder, if a predetermined selection command is input by a user, the mode detection unit provides the output signal of the frequency multiplying unit to the clock reproduction unit through the second switch unit.

25. The dual mode decoder of claim 21, wherein the MB810 decoder comprises:
- a table storage unit which stores code tables having data codes written therein, the data codes generated by forming 12 state points in the form of a 4×3 matrix on a state transition map formed with binary unit digital sum variation & alternate sum variation (BUDA) to generate a 10-bit code from 8-bit data, and outputting a 10-bit code from a predetermined state point forming the matrix, and then, supplementing second codes having state points lacked in first codes forming complementary pairs selected from a set of 10-bit codes capable of arriving at state points forming the matrix, and then, selecting control codes including IDLE code among the first and second codes, and removing codes generating the IDLE code by a bit string between neighboring codes among the second codes, and codes that are selected as the control codes;
- a decoding unit which based on the contents of a 10-bit code input from the outside, reads out an 8-bit data code or an 8-bit control code from a code table stored in the table storage unit;
- a first buffer unit which stores the 8-bit data code input from the decoding unit and then outputs the code to the outside; and
- a second buffer unit which stores the 8-bit control code input from the decoding unit and then outputs the code to the outside.

26. The dual mode decoder of claim 21, wherein the 8B/10B decoder is a decoder complying with IEEE 802.3ae specifications.

27. The dual mode decoder of claim 21, wherein when performing initialization or during an IDLE cycle, the IDLE code detection unit detects +K28.5/−K28.5 and/or +K28.7/−K28.7 codes that are IDLE codes and transfers to the mode detection unit, and if the K28.7 code is continuously detected more than a predetermined reference frequency, recognizes the 10-bit code as IDLE code of the MB810 decoder.

28. The dual mode decoder of claim 21, wherein by analyzing the contents of the IDLE code input from the IDLE code detection unit, the mode detection unit detects the operation decoder between the MB810 decoder and the 8B/10B decoder, and provides the detection result to the first switch unit, the first selection unit, the second selection unit, the MB810 decoder, and the 8B/10B decoder.

29. The dual mode decoder of claim 21, wherein the cut-off frequency by combination of the first low pass filter and a low pass filter arranged in an MB810 encoder corresponding to the MB810 decoder is half the cut-off frequency by combination of the second low pass filter and a low pass filter arranged in an 8B/10B encoder corresponding to the 8B/10B decoder, and the roll of characteristics of the first low pass filter and the second low pass filter are identical.

30. The dual mode decoder of claim 21, wherein the cut-off frequency and roll off characteristic of the second low pass filter are the same as a cut-off frequency and roll off characteristic defined in IEEE 802.3.

31. The dual mode decoder of claim 21, wherein in an initial state, the first switch unit selects the 10-bit code output from the second low pass filter corresponding to the 8B/10B decoder, as an output signal.

32. The dual mode decoder of claim 21, wherein by performing a mode detection process based on IDLE code detected from the 10-bit code input by the IDLE code detection unit, the mode detection unit detects a decoder to be used as an operation decoder between the MB810 decoder and the 8B/10B decoder, and the mode detection process comprises:
- initializing a counter counting the number of IDLE codes;
- receiving a first code from the IDLE code detection unit;
- checking whether the first code is +K28.7 code or −K28.7 code;
- if the first code is +K28.7 code or −K28.7 code, increasing the counter by a predetermined increasing amount and receiving a second code following the first code from the IDLE code detection unit;
- checking whether the second code is +K28.7 code or −K28.7 code;
- if the number of K28.7 codes continuously input from the IDLE code detection unit is less than a predetermined first reference number, performing the receiving a first code from the IDLE code detection unit, and if the number of K28.7 codes continuously input from the IDLE code detection unit is equal to or greater than the predetermined first reference number, determining the MB810 decoder as the operation decoder;
- if the result of checking whether the first code is +K28.7 code or −K28.7 code indicates that the received IDLE code is −K28.7 code, receiving the IDLE code detected from the 10-bit code by the IDLE code detection unit and increasing the counter by the increased amount, and if the result of checking whether the first code is +K28.7 code or −K28.7 code indicates that the received IDLE code is not −K28.7 code, checking whether the received IDLE code is +K28.5 code;
- If the received IDLE code is +K28.7 code, performing the receiving a first code from the IDLE code detection unit, or determining the MB810 decoder as the operation decoder according to whether or not the number of K28.7 codes continuously input from the IDLE code detection unit is less than the predetermined first reference number, and if the received IDLE code is not +K28.7 code, determining that there is an error in transmission lines and performing the initializing a counter counting the number of IDLE codes, or transmitting a test code;
- If the result of the checking whether the received IDLE code is +K28.5 code indicates that the received IDLE code is K28.5 code, receiving IDLE code detected from the 10-bit code by the IDLE code detection unit and increasing the counter by the increased amount;

If the number of K28.5 codes continuously received from the IDLE code detection unit is less than a predetermined second reference number, performing the receiving a first code from the IDLE code detection unit, and If the number of K28.5 codes continuously received from the IDLE code detection unit is equal to or greater than the predetermined second reference number, determining the 8B/10B decoder as the operation decoder;

If the result of the checking whether the received IDLE code is +K28.5 code indicates that the received IDLE code is not +K28.5 code, checking whether or not the received IDLE code is −K28.5 code; and if the received IDLE code is −K28.5 code, receiving IDLE code detected from the 10-bit code by the IDLE code detection unit and increasing the counter by the increased amount, and then performing the receiving a first code from the IDLE code detection unit, or determining the 8B/10B decoder as the operation decoder according to whether or not the number of K28.5 codes continuously received from the IDLE code detection unit is less than the predetermined second reference number, and if the received IDLE code is not −K28.5 code, determining that there is an error in transmission lines and performing the initializing a counter counting the number of IDLE codes, or transmitting a test code.

33. The dual mode decoder of claim 32, wherein the initializing a counter counting the number of IDLE codes is performed when IDLE time continues exceeding a predetermined.

* * * * *